(12) United States Patent
Ariyoshi

(10) Patent No.: US 10,256,245 B2
(45) Date of Patent: Apr. 9, 2019

(54) THREE-DIMENSIONAL MEMORY DEVICE WITH SHORT-FREE SOURCE SELECT GATE CONTACT VIA STRUCTURE AND METHOD OF MAKING THE SAME

(71) Applicant: SANDISK TECHNOLOGIES LLC, Plano, TX (US)

(72) Inventor: Junichi Ariyoshi, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/632,703

(22) Filed: Jun. 26, 2017

(65) Prior Publication Data
US 2018/0261613 A1    Sep. 13, 2018

Related U.S. Application Data

(60) Provisional application No. 62/469,618, filed on Mar. 10, 2017.

(51) Int. Cl.
| | |
|---|---|
| *H01L 27/11556* | (2017.01) |
| *H01L 27/11524* | (2017.01) |
| *H01L 27/1157* | (2017.01) |
| *H01L 23/522* | (2006.01) |
| *H01L 27/11565* | (2017.01) |
| *H01L 27/11582* | (2017.01) |
| *H01L 27/11573* | (2017.01) |

(52) U.S. Cl.
CPC .... *H01L 27/11556* (2013.01); *H01L 23/5226* (2013.01); *H01L 27/1157* (2013.01);
(Continued)

(58) Field of Classification Search
CPC ......... H01L 27/11524; H01L 27/11529; H01L 27/11551; H01L 27/11548;
(Continued)

(56) References Cited

U.S. PATENT DOCUMENTS

| | | |
|---|---|---|
| 9,412,749 B1 | 8/2016 | Shimabukuro et al. |
| 9,576,967 B1 | 2/2017 | Kimura et al. |

(Continued)

FOREIGN PATENT DOCUMENTS

WO   WO2016205078 A2   12/2016

OTHER PUBLICATIONS

Endoh et al., "Novel Ultra High Density Memory with a Stacked-Surrounding Gate Transistor (S-SGT) Structured Cell," IEDM Proc., (2001), 33-36.
(Continued)

*Primary Examiner* — Sonya D. McCall-Shepard
(74) *Attorney, Agent, or Firm* — The Marbury Law Group PLLC

(57) ABSTRACT

Electrical short caused by misalignment of source select level contact via structure and support pillar structures can be prevented by modifying the pattern of the support pillar structures such that the support pillar structures are omitted from the area in which source select gate contact via structures are formed. The insulating layer at the level overlying the source select level electrically conductive layer can have a sufficient thickness to prevent deformation during formation of the backside recesses. A minimum lateral separation distance between the source select level contact via structure and the support pillar structures is greater than any minimum lateral separation distance between the word line level contact via structures and the support pillar structures.

11 Claims, 30 Drawing Sheets

(52) U.S. Cl.
CPC .. *H01L 27/11524* (2013.01); *H01L 27/11565* (2013.01); *H01L 27/11573* (2013.01); *H01L 27/11582* (2013.01)

(58) Field of Classification Search
CPC ........... H01L 27/11556; H01L 27/1157; H01L 23/5226; H01L 27/11565; H01L 27/11582; H01L 27/11573
See application file for complete search history.

(56) References Cited

U.S. PATENT DOCUMENTS 9,659,956 B1    5/2017   Pachamuthu et al.
2016/0343727 A1 11/2016  Kim et al.

OTHER PUBLICATIONS

U.S. Appl. No. 15/243,260, filed Aug. 22, 2016, SanDisk Technologies LLC.
U.S. Appl. No. 15/296,380, filed Oct. 18, 2016, SanDisk Technologies LLC.
U.S. Appl. No. 15/335,850, filed Oct. 27, 2016, SanDisk Technologies LLC.
U.S. Appl. No. 15/347,101, filed Nov. 9, 2016, SanDisk Technologies LLC.
U.S. Appl. No. 15/411,126, filed Jan. 20, 2017, SanDisk Technologies LLC.
U.S. Appl. No. 15/607,583, filed May 29, 2017, SanDisk Technologies LLC.
International Search Report and Written Opinion of the International Searching Authority for International Patent Application No. PCT/US2017/063478, dated Mar. 15, 2018, 14 pages.

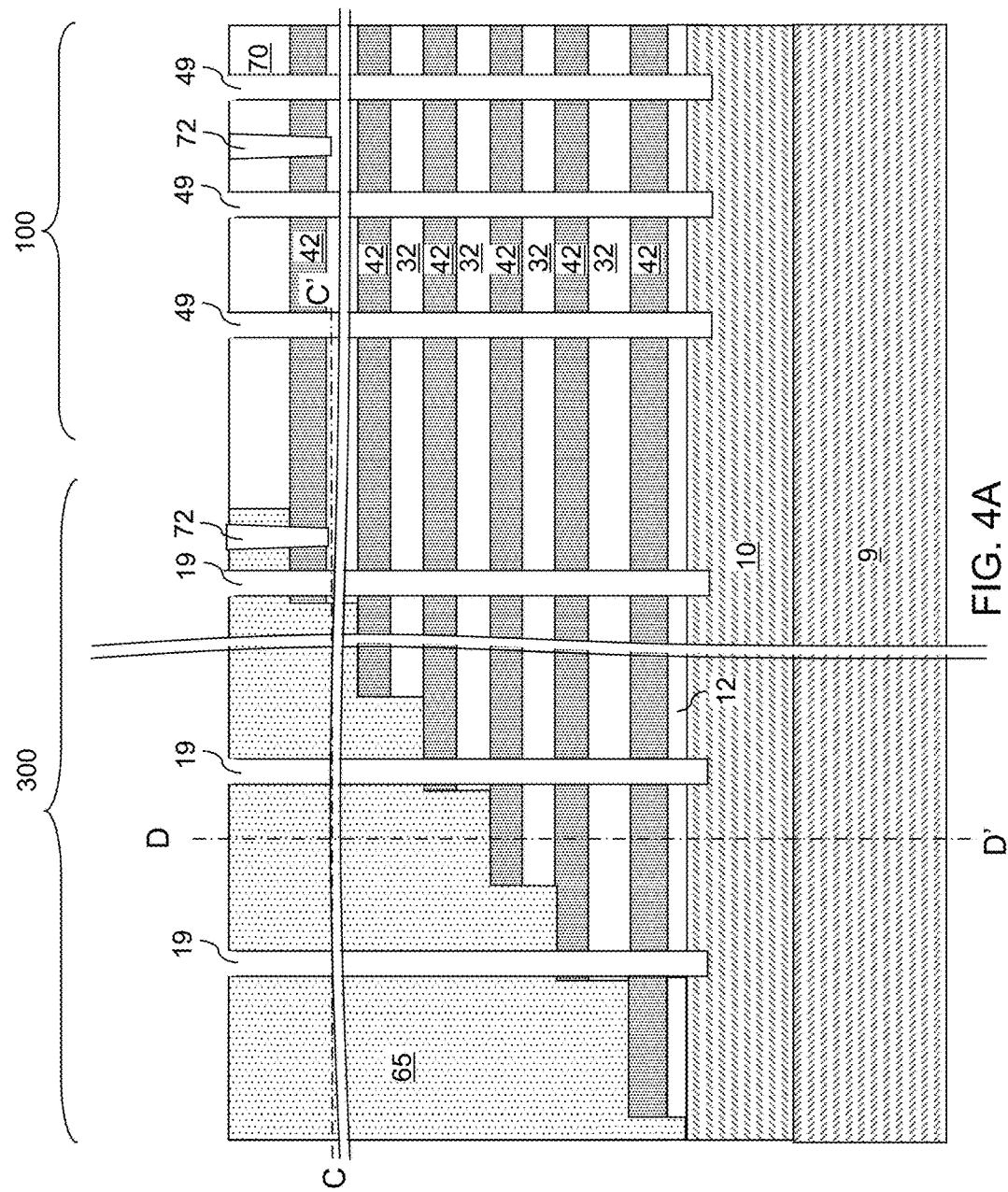

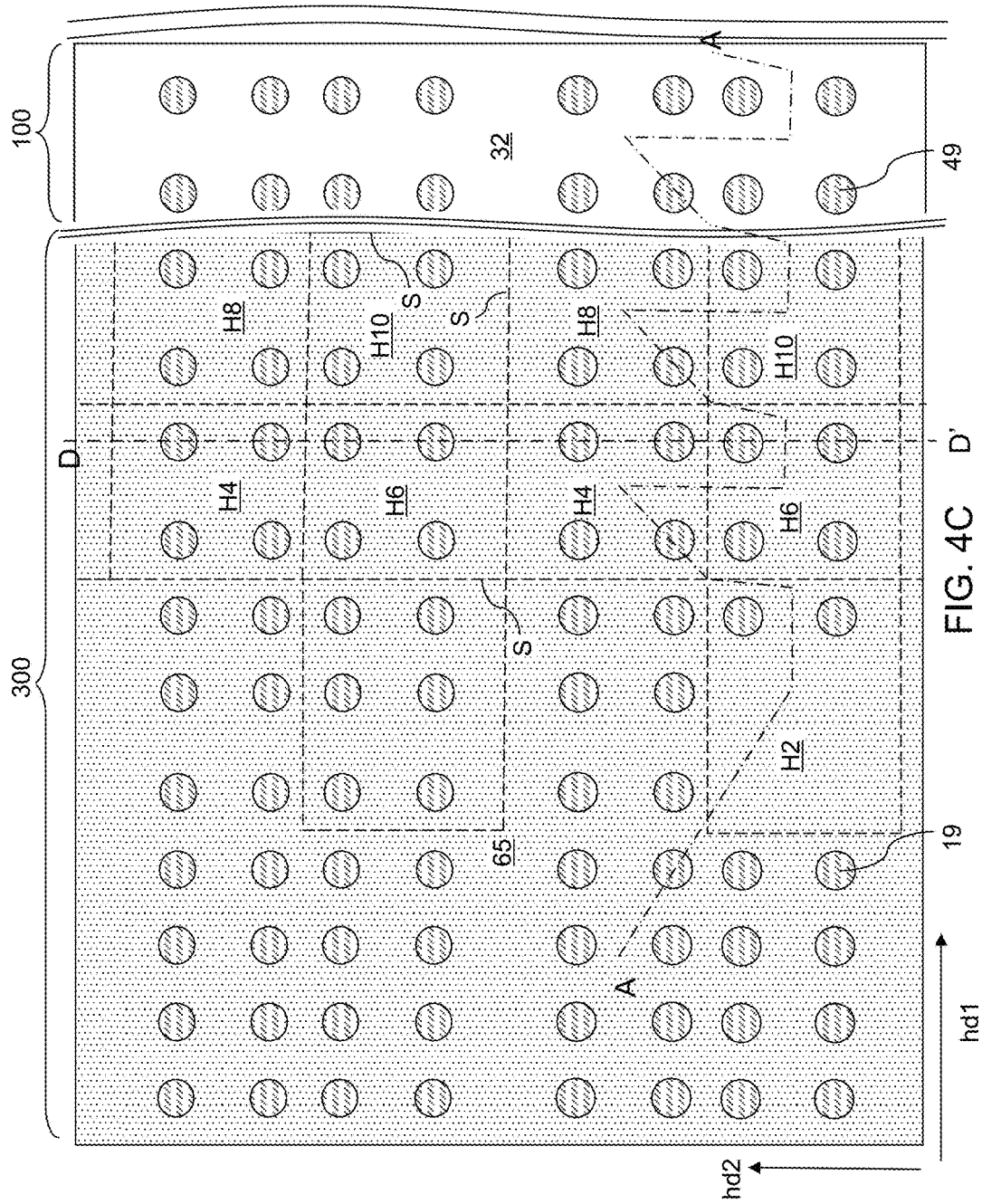

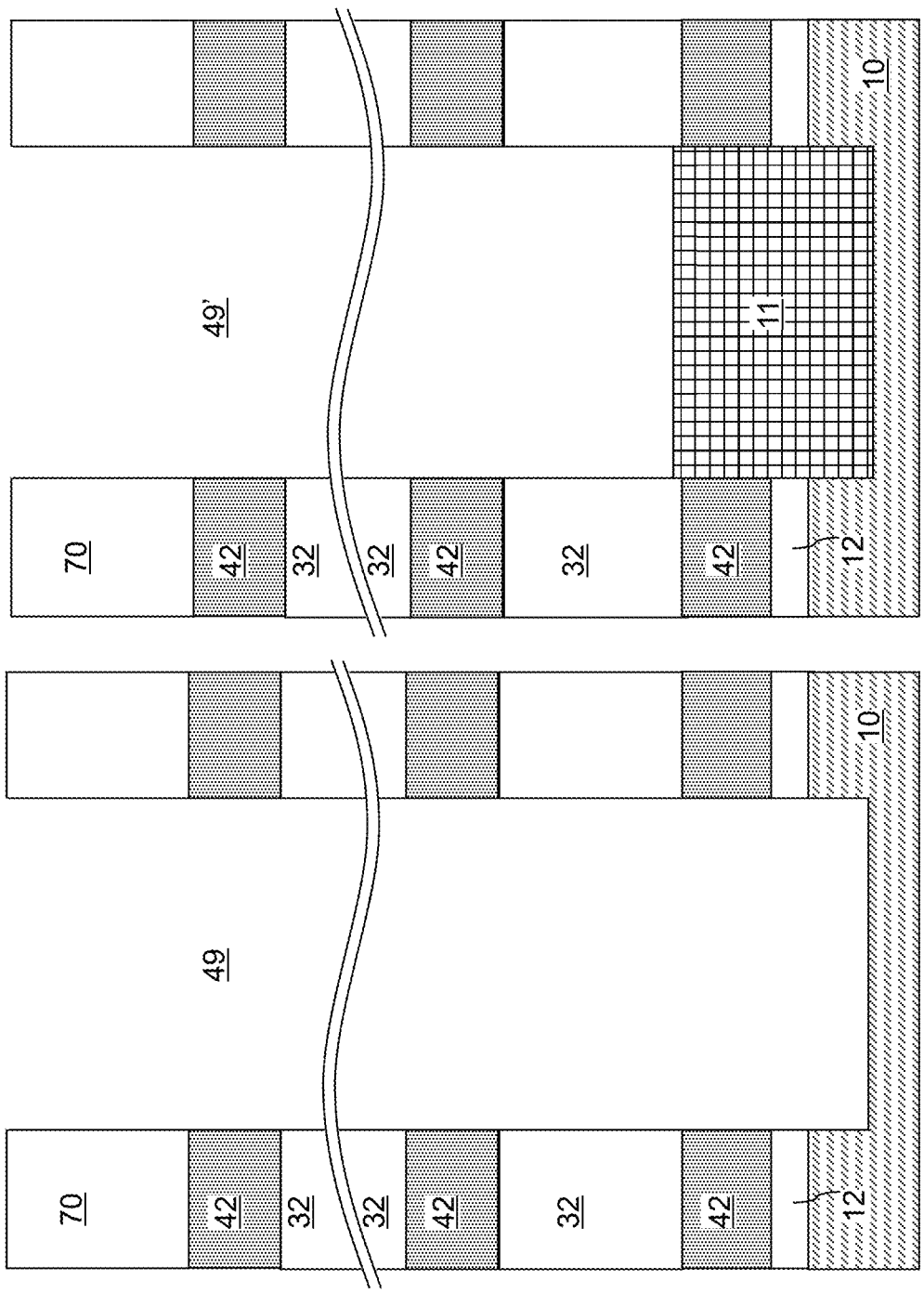

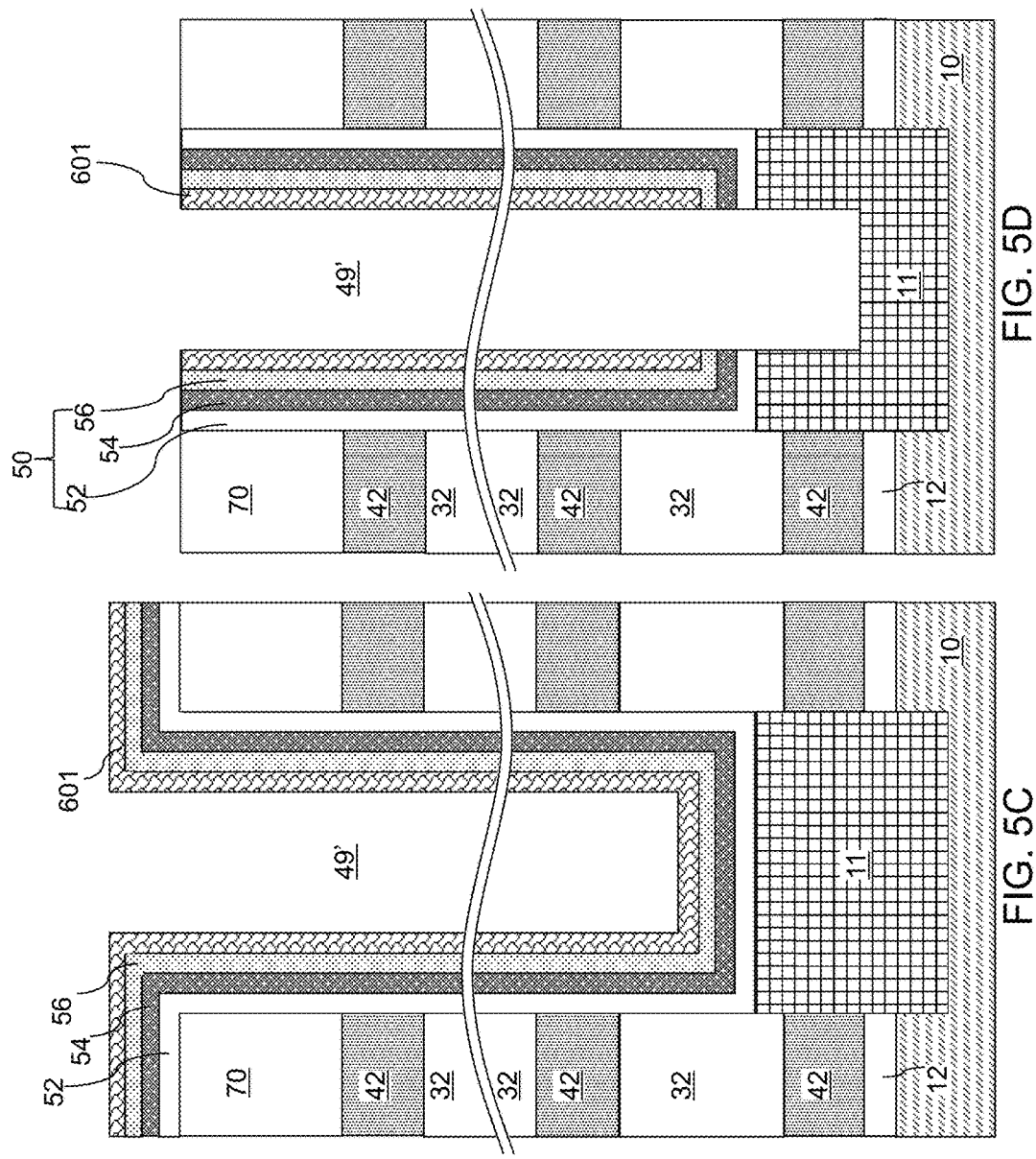

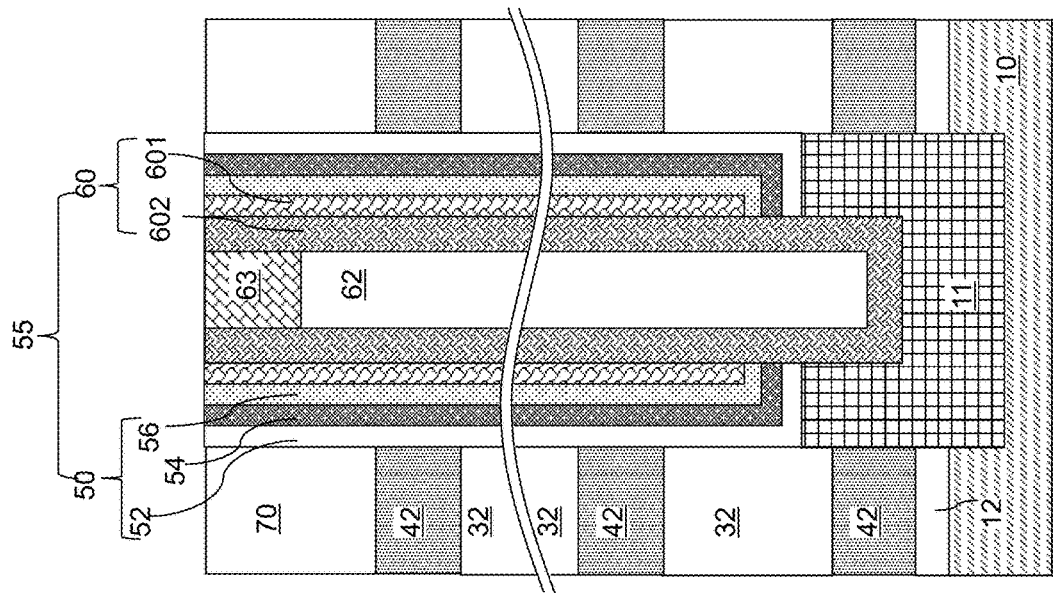
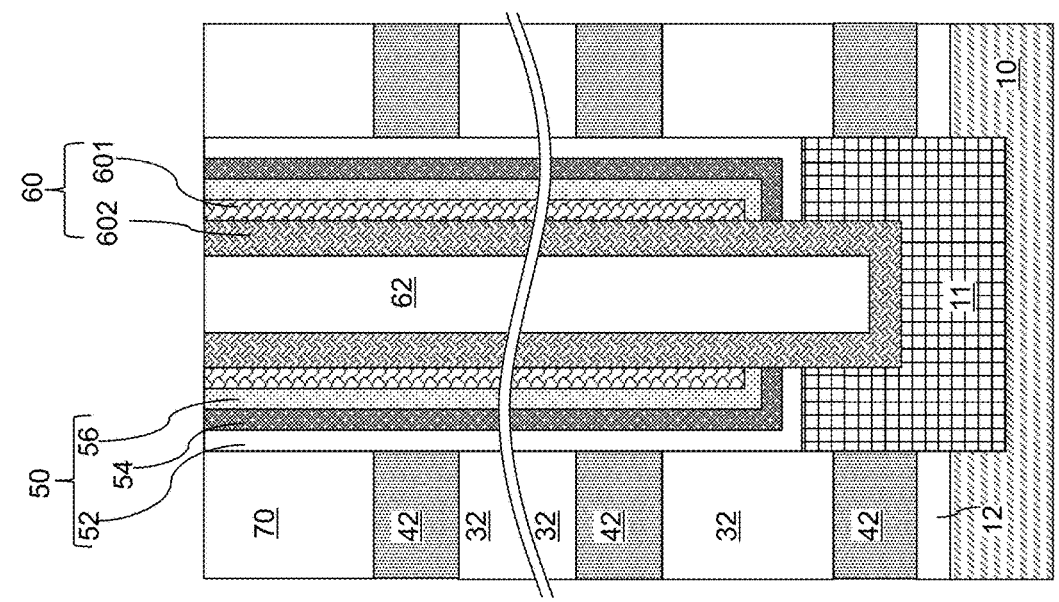
FIG. 5H
FIG. 5G

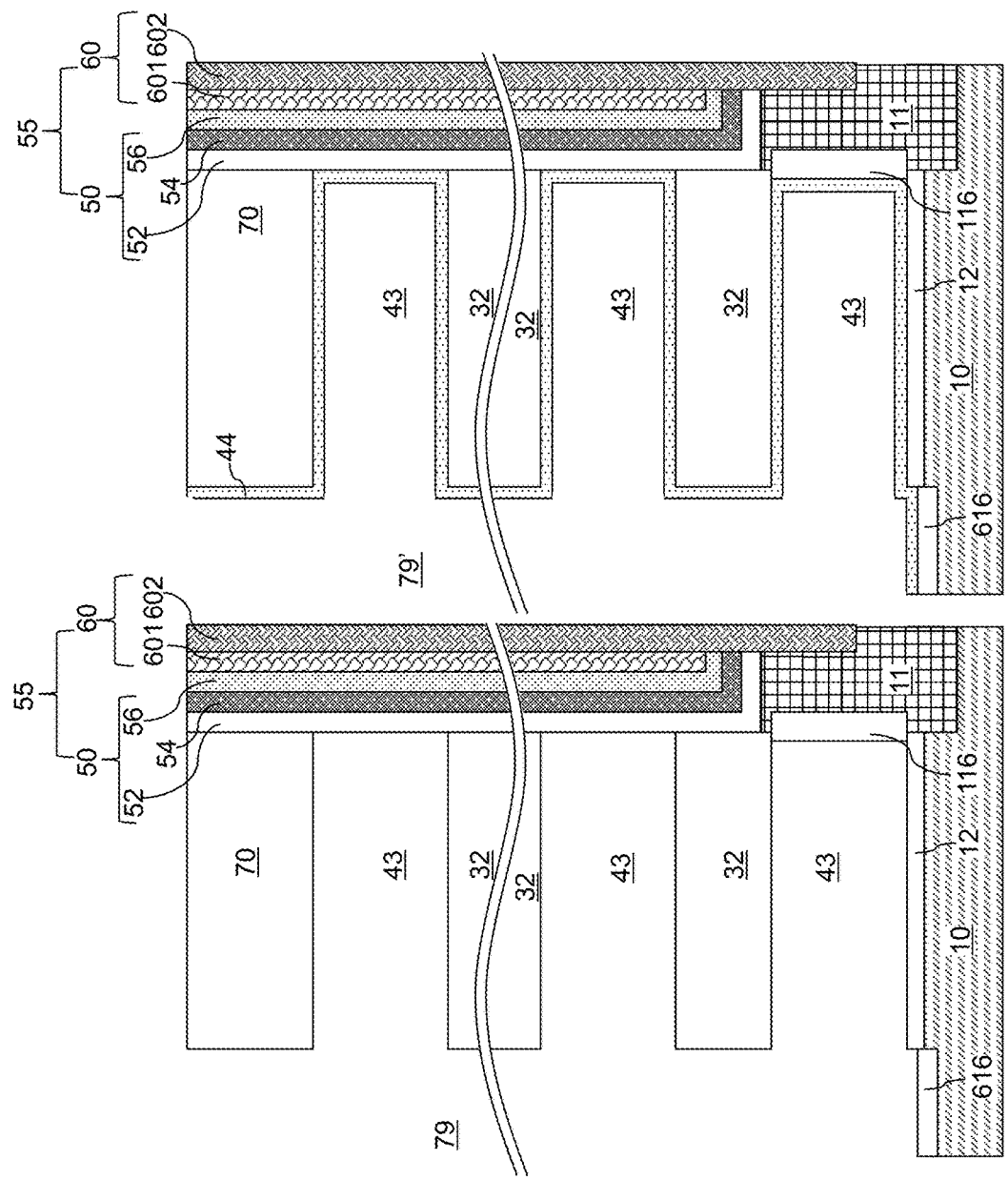

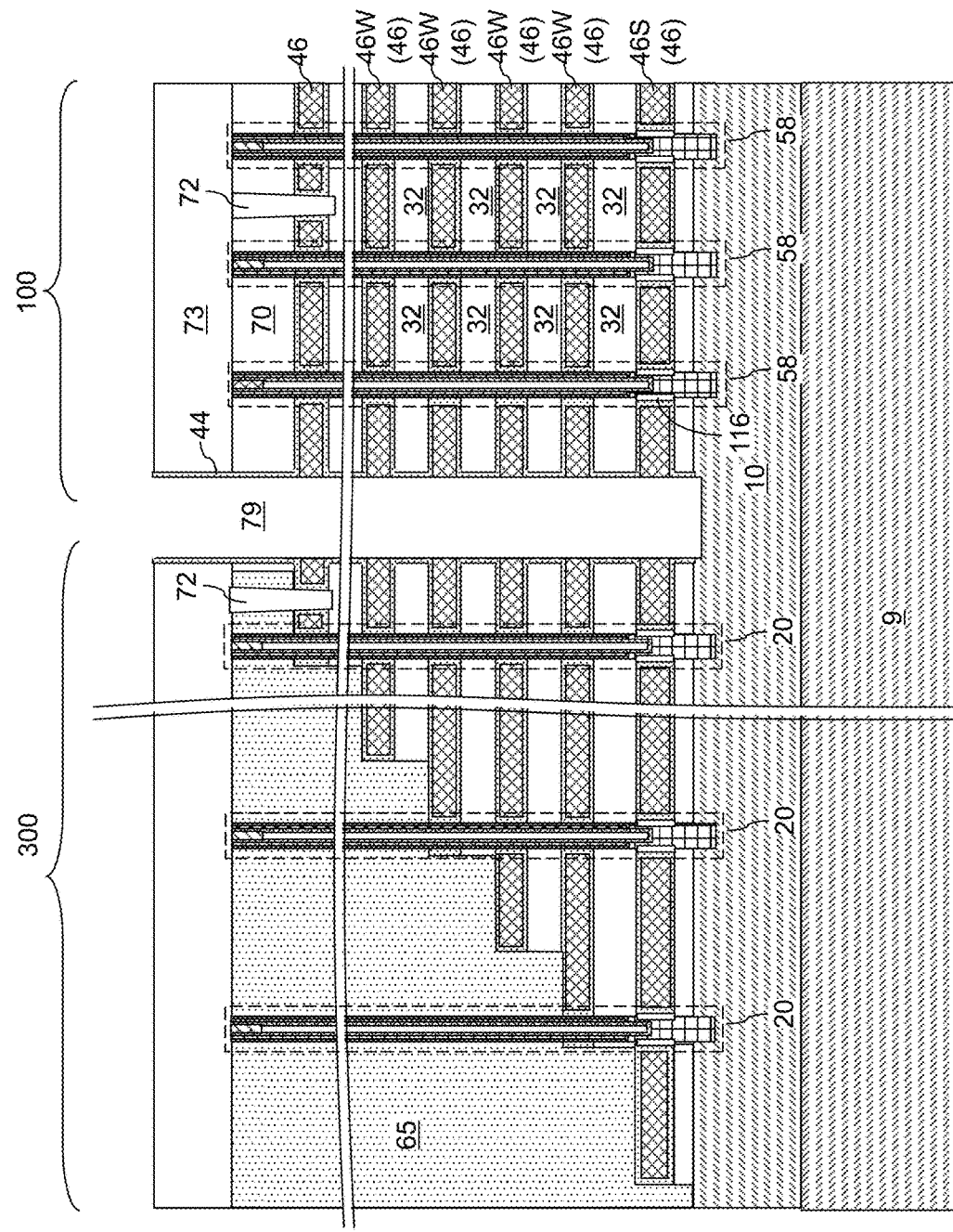

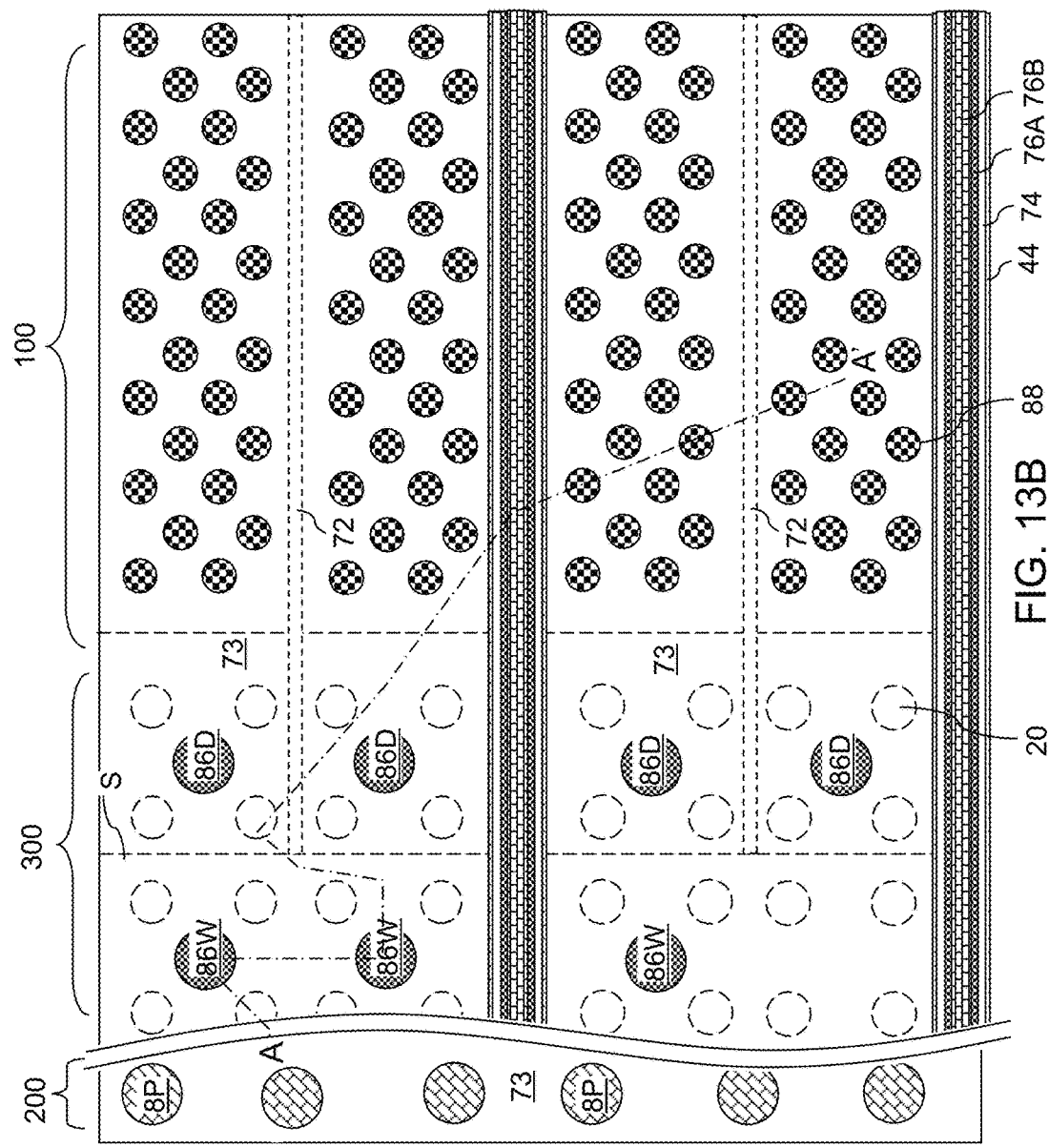

though the retro-stepped dielectric material portion and
directly on a top surface of a respective one of the electrically conductive layers. The electrically conductive layers comprise a source select level electrically conductive layer and word line level electrically conductive layers overlying the source select level electrically conductive layer. A source select level contact via structure contacts the source select level electrically conductive layer. Word line level contact via structures contact a respective one of the word line level electrically conductive layers. A minimum lateral separation distance between the source select level contact via structure and the support pillar structures is greater than any minimum lateral separation distance between the word line level contact via structures and the support pillar structures.

THREE-DIMENSIONAL MEMORY DEVICE WITH SHORT-FREE SOURCE SELECT GATE CONTACT VIA STRUCTURE AND METHOD OF MAKING THE SAME

FIELD

The present disclosure relates generally to the field of semiconductor devices, and particular to a three-dimensional memory device employing a short-free source select gate contact via structure and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein the electrically conductive layers comprise a source select level electrically conductive layer and word line level electrically conductive layers located over the source select level electrically conductive layer; memory stack structures extending through the alternating stack, wherein each of the memory stack structures comprises a memory film and a vertical semiconductor channel contacting an inner sidewall of the memory film; a terrace region in which each electrically conductive layer other than a topmost electrically conductive layer within the alternating stack laterally extends farther than an overlying electrically conductive layer within the alternating stack; a retro-stepped dielectric material portion overlying the terrace region; support pillar structures located in the terrace region and extending through the retro-stepped dielectric material portion and the alternating stack; a source select level contact via structure extending though the retro-stepped dielectric material portion and contacting the source select level electrically conductive layer; and word line level contact via structures extending though the retro-stepped dielectric material portion and contacting a respective one of the word line level electrically conductive layers. A minimum lateral separation distance between the source select level contact via structure and the support pillar structures is greater than any minimum lateral separation distance between the word line level contact via structures and the support pillar structures.

According to another aspect of the present disclosure, a method of forming a three-dimensional memory device is provided, which comprises the steps of: forming a terrace region in which each sacrificial material layer other than a topmost sacrificial material layer within the alternating stack laterally extends farther than an overlying sacrificial material layer within the alternating stack; forming an alternating stack of insulating layers and sacrificial material layers over a substrate; forming memory stack structures and support pillar structures extending through the alternating stack; forming a retro-stepped dielectric material portion over the terrace region; replacing the sacrificial material layers with electrically conductive layers; and forming contact via structures though the retro-stepped dielectric material portion and

BRIEF DESCRIPTION OF THE DRAWINGS

FIG. 4A is a zig-zag schematic vertical cross-sectional view of the exemplary structure after formation of memory openings and support openings according to an embodiment of the present disclosure.

FIG. 4C is a horizontal cross-sectional view of the exemplary structure of FIGS. 4A and 4B along the horizontal plane C-C' of FIG. 4A.

FIGS. 5A-5H are sequential schematic vertical cross-sectional views of a memory opening within the exemplary structure up to the processing step of deposition of a second semiconductor channel layer according to an embodiment of the present disclosure.

FIGS. 9A-9D are sequential vertical cross-sectional views of a region of the exemplary structure during formation of electrically conductive layers according to an embodiment of the present disclosure.

FIG. 11 is a zig-zag schematic vertical cross-sectional view of the exemplary structure after removal of a deposited conductive material from within the backside trench according to an embodiment of the present disclosure.

FIG. 13B is a top-down view of the exemplary structure of FIG. 13A. The vertical plane A-A' is the plane of the schematic vertical cross-sectional view of FIG. 13A.

DETAILED DESCRIPTION

Figure 1:
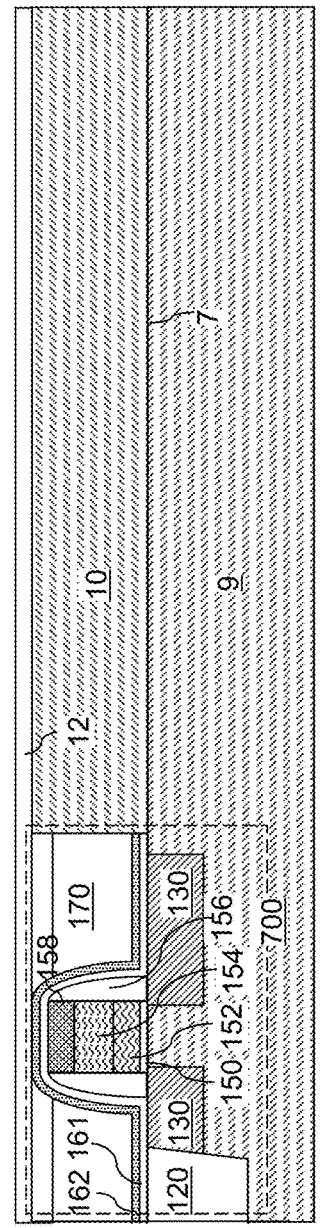
FIG. 1 is a schematic vertical cross-sectional view of an exemplary structure after formation of at least one peripheral device, a semiconductor material layer, and a gate dielectric layer according to an embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, an exemplary structure according to an embodiment of the present disclosure is illustrated, which can be employed, for example, to fabricate a device structure containing vertical NAND memory devices. The exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^5$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^5$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, a gate electrode (152, 154), and a gate cap dielectric 158. The gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200. Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

Figure 2:
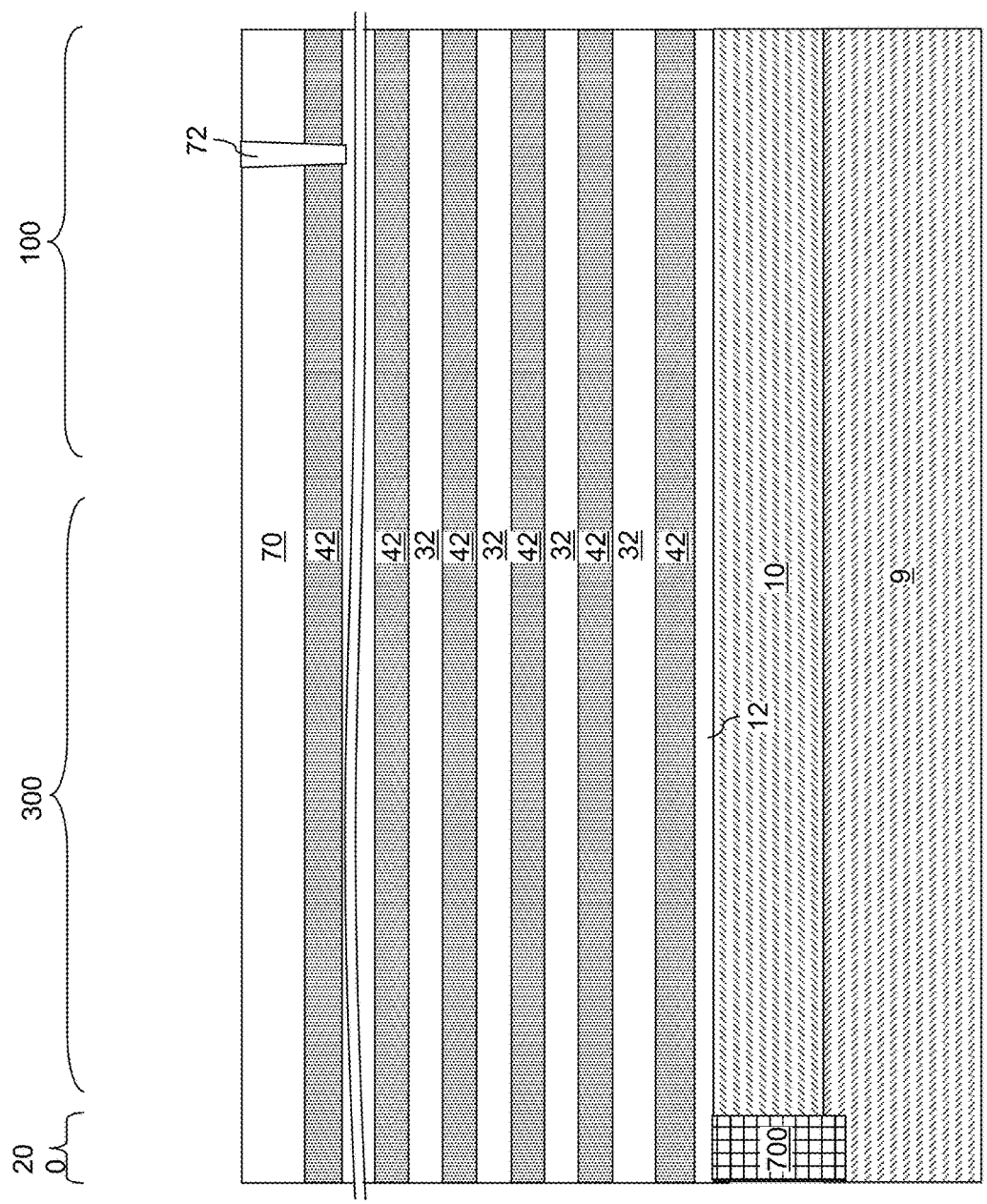
FIG. 2 is a schematic vertical cross-sectional view of the exemplary structure after formation of an alternating stack of insulating layers and sacrificial material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
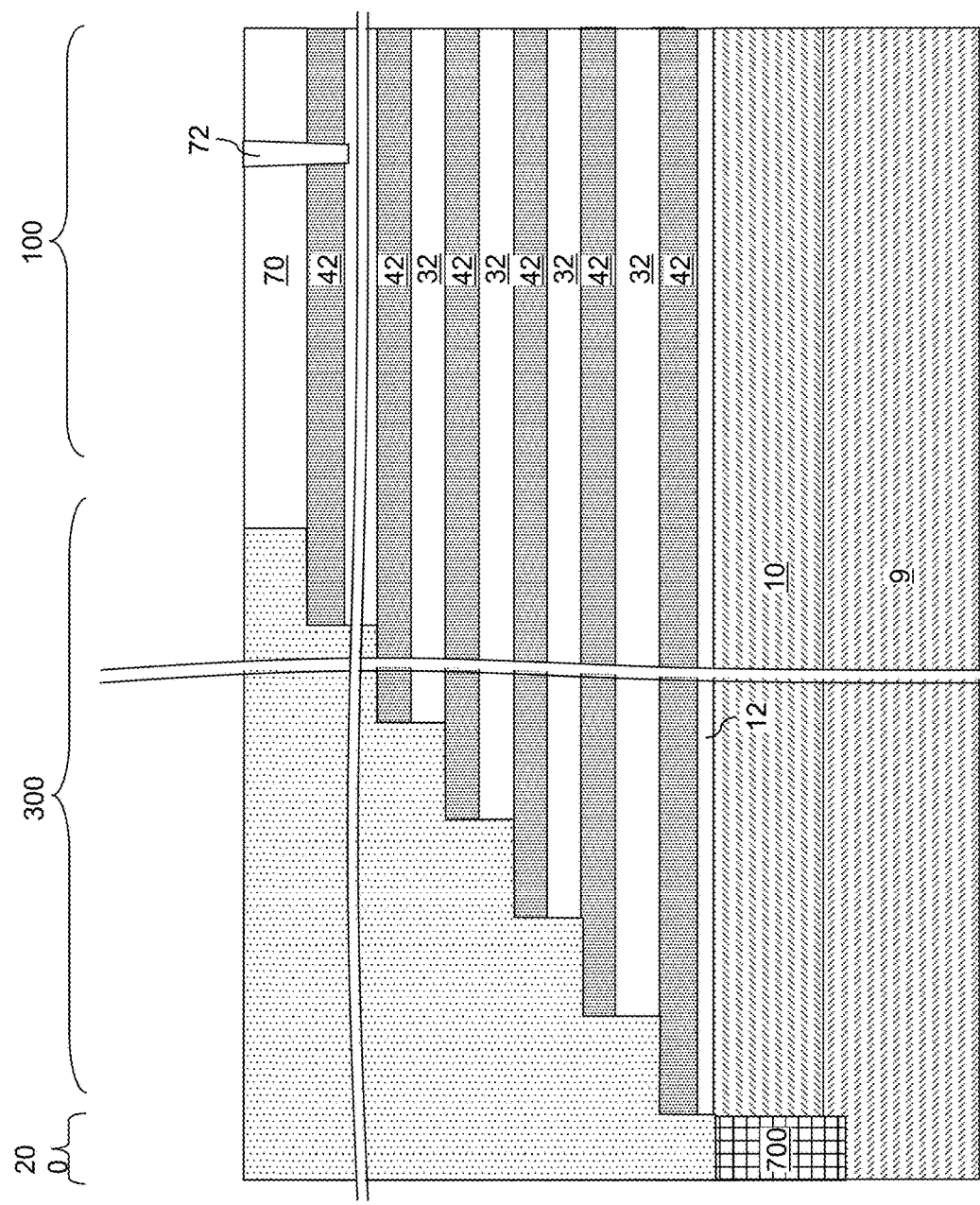
FIG. 3 is a schematic vertical cross-sectional view of the exemplary structure after formation of stepped terraces and a retro-stepped dielectric material portion according to an embodiment of the present disclosure.

Referring to FIG. 3, a stepped cavity can be formed within the contact region 300 which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than overlying sacrificial material layer(s) 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Referring to FIGS. 4A-4D, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the contact region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the contact region 300.

The memory openings 49 extend through each layer of the alternating stack (32, 42) in the memory array region 100. The support openings 19 extend through a subset of layers within the alternating stack (32, 42). A predominant subset (more than 50%), or all, of the support openings 19, can be formed through the retro-stepped dielectric material portion 65 in the terrace region. The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can be formed through the gate dielectric layer 12 so that the memory openings 49 and the support openings 19 extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10. Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the contact region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

The stepped surfaces of the alternating stack (32, 42) include vertical steps S that are adjoined to horizontal surfaces (i.e., tops of steps) H. A top edge of each vertical step S (i.e., side of a step) can be connected to an edge of an upper horizontal surface (i.e., top of the step), and a bottom edge of each vertical step S can be connected to an edge of a lower horizontal surface (i.e., top of an underlying step or the bottom surface of the staircase). In one embodiment, the vertical steps S can be perpendicular to a first horizontal direction hd1 (e.g., word line direction), along which the lateral extent of the layers of the alternating stack (32, 42) varies. In one embodiment, each step can include one insulating layer 32 and one sacrificial material layer 42.

In another optional embodiment, one subset of the vertical steps S can be perpendicular to a first horizontal direction hd1, and another subset of the vertical steps S can be perpendicular to a second horizontal direction hd2 (e.g., bit line direction), which is perpendicular to the first horizontal direction hd1. In this embodiment, first stepped surfaces that change height along the first horizontal direction by two insulating layers 32 and two sacrificial material layers 42 at each vertical step S can be provided adjacent to second stepped surfaces that change height along the first horizontal direction hd1 by two insulating layers 32 and two sacrificial material layers 42. The levels of the horizontal surfaces of the first stepped surfaces can be vertically offset from the levels of the horizontal surfaces of the second stepped surfaces by a pair of an insulating layer 32 and a sacrificial material layer 42.

Figure 4B:
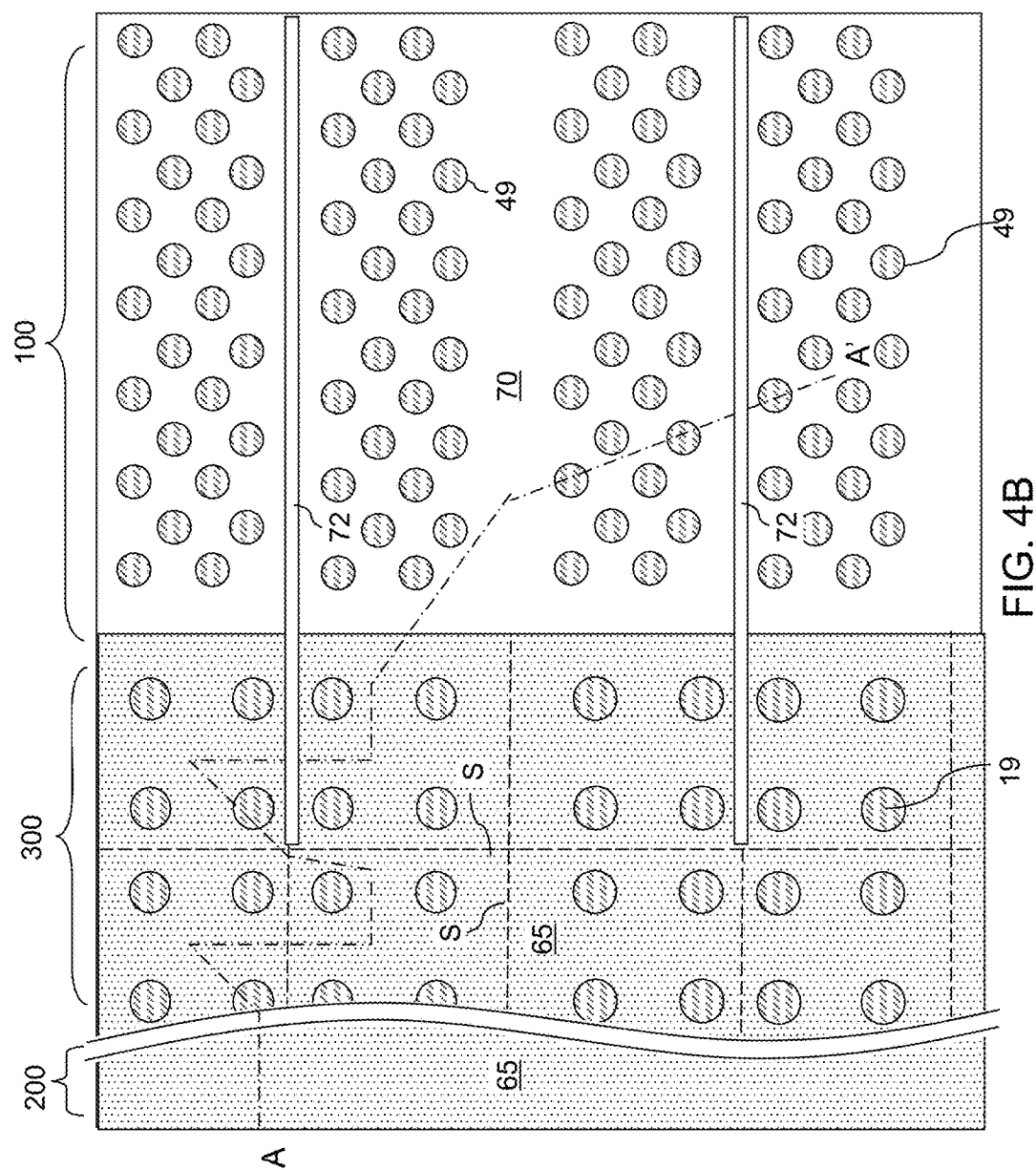
FIG. 4B is a top-down view of the exemplary structure of FIG. 4A. The vertical plane A-A' is the plane of the cross-section for FIG. 4A.
Figure 4D:
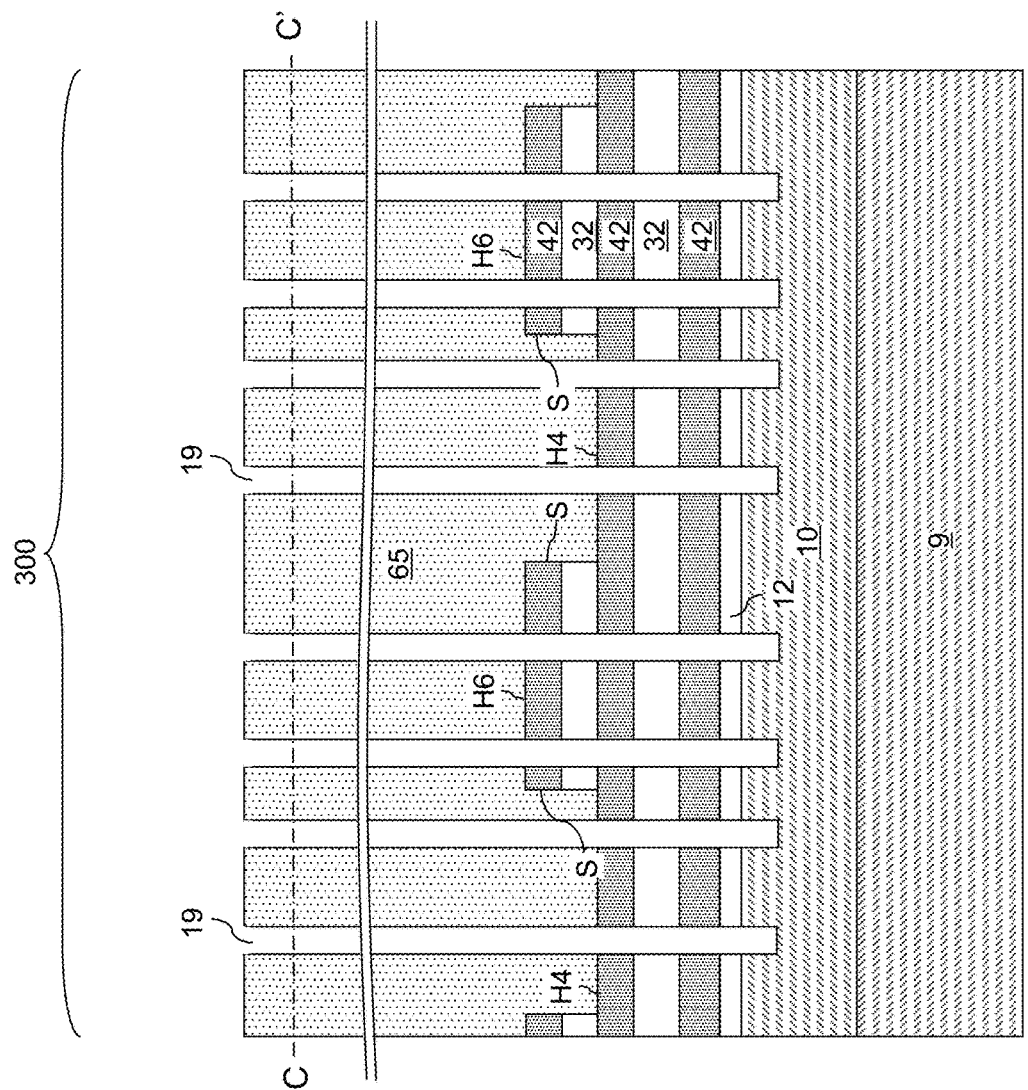
FIG. 4D is a vertical cross-sectional view of the exemplary structure of FIGS. 4A-4C along the vertical plane D-D' of FIGS. 4A and 4C.

In the example shown in FIGS. 4C and 4D, each vertical step S differs from the two adjacent vertical steps in the second horizontal direction hd2 by two layers (e.g., one insulating layer 32 and one sacrificial material layer 42). This forms a repeating pattern of two steps offset by two layers in the second horizontal direction, as shown in FIG. 4D. In this example shown in FIG. 4C, the horizontal surface (i.e., top of step) H2 overlies two layers (e.g., one insulating layers 32 and one sacrificial material layer 42), the horizontal surfaces (i.e., top of steps) H4 each overly four layers (e.g., two insulating layers 32 and two sacrificial material layers 42), the horizontal surfaces H6 each overly six layers, the horizontal surfaces H8 each overly eight layers, the horizontal surfaces H10 each overly ten layers, and so on. In this example, each vertical step S differs from the two adjacent vertical steps in the first horizontal direction hd1 by four layers (e.g., two insulating layers 32 and two sacrificial material layers 42). However, other step configurations may be used.

Generally, N (where N is an integer greater than zero) stepped surfaces can be provided along the second horizontal direction hd2 such that each of the N stepped surfaces changes height along the first horizontal direction hd1 by N insulating layers 32 and N sacrificial material layers 42 at each vertical step S that is perpendicular to the first horizontal direction hd1. The collection of the N stepped surfaces provide horizontal surfaces H for each level of the sacrificial material layers 42. For example, if N=3, then there can be a repeating pattern of three vertical steps S in the second horizontal direction hd2, in which each step height between adjacent vertical steps S differs by three insulating layers 32 and three sacrificial material layers 42 (six total layers) in the first horizontal direction hd1.

The bottommost sacrificial material layer 42 corresponds to a source select gate level. In one embodiment, the contact area of the horizontal top surface of the bottommost sacrificial material layer 42 contacting the retro-stepped dielectric material portion 65 can be greater than any contact area between a sacrificial material layer 42 other than the bottommost sacrificial material layer 42 and the retro-stepped dielectric material portion 65.

In one embodiment, a region of the contact area of the horizontal top surface of the bottommost sacrificial material layer 42 can be free of any support opening 19 or memory opening 49 therethrough. In one embodiment, the region of the contact area of the horizontal top surface of the bottommost sacrificial material layer 42 that is free of any support opening 49 or memory opening 49 therethrough can include an area that is bordered by a vertical step S that is perpendicular to the first horizontal direction, and by segments of two vertical steps S that are parallel to the first horizontal direction hd1. In this case, the region of the contact area of the horizontal top surface of the bottommost sacrificial material layer 42 that is free of any support opening 19 therethrough may include more than 50% of the entire contact area of the horizontal top surface of the bottommost sacrificial material layer 42 contacting the retro-stepped dielectric material portion 65.

FIGS. 5A-5H illustrate structural changes in a memory opening 49, which is one of the memory openings 49 in the exemplary structure of FIGS. 4A and 4B. The same structural change occurs simultaneously in each of the other memory openings 49 and in each support opening 19.

Referring to FIG. 5A, a memory opening 49 in the exemplary device structure of FIGS. 4A and 4B is illustrated. The memory opening 49 extends through the insulating cap layer 70, the alternating stack (32, 42), the gate dielectric layer 12, and optionally into an upper portion of the semiconductor material layer 10. At this processing step, each support opening 19 can extend through the retro-stepped dielectric material portion 65, a subset of layers in the alternating stack (32, 42), the gate dielectric layer 12, and optionally through the upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by a selective semiconductor deposition process. The selective semiconductor deposition process grows a semiconductor material from semiconductor surfaces, such as surfaces of the semiconductor material layer 10 in the substrate (9, 10), and does not grow the semiconductor material from dielectric surfaces. The pedestal channel portions 11 can include a single crystalline semiconductor material if the semiconductor material layer 10 is single crystalline. Alternatively, the pedestal channel portions 11 can include a polycrystalline semiconductor material.

In case the semiconductor material layer 10 is single crystalline and a selective epitaxy process is employed as a selective semiconductor deposition process, each pedestal channel portion 11 can comprise a single crystalline semiconductor material in epitaxial alignment with the single crystalline semiconductor material of the semiconductor material layer 10. In one embodiment, the pedestal channel portion 11 can be doped with electrical dopants of the same conductivity type as the semiconductor material layer 10.

In one embodiment, the top surface of each pedestal channel portion 11 can be formed above a horizontal plane including the top surface of the bottommost sacrificial material layer 42, and below a horizontal plane including the bottom surface of the second-from-the-bottom sacrificial material layer 42, i.e., the sacrificial material layer 42 that is most proximal to the bottommost sacrificial material layer 42. In this case, a source select gate electrode can be subsequently formed by replacing the sacrificial material layer 42 located below the horizontal plane including the top surfaces of the pedestal channel portions 11 with a conductive material layer, as will be described below with respect to FIGS. 13A-13E. In another embodiment, several lower sacrificial material layers can be replaced with electrically conductive layers to form several source select gate electrodes, as will be described below with respect to FIGS. 14A-14B. A predominant subset of the support openings 19 pass through more than two sacrificial material layers 42.

Pedestal channel portions 11 that are formed in such support openings 19 do not physically contact the retro-stepped dielectric material portion. Some support openings 19 pass through the bottommost sacrificial material layer 42, and do not pass through any other sacrificial material layer 42. Pedestal channel portions 11 that are formed in such support openings 19 physically contact a sidewall of the retro-stepped dielectric material portion 65.

The pedestal channel portion 11 can be a portion of a transistor channel that extends between a source region to be subsequently formed in the substrate (9, 10) and a drain region to be subsequently formed in an upper portion of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49. The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer can be deposited, for example, by chemical vapor deposition (CVD), atomic layer deposition (ALD), pulsed laser deposition (PLD), liquid source misted chemical deposition, or a combination thereof. The thickness of the dielectric metal oxide layer can be in a range from 1 nm to 20 nm, although lesser and greater thicknesses can also be employed. The dielectric metal oxide layer can subsequently function as a dielectric material portion that blocks leakage of stored electrical charges to control gate electrodes. In one embodiment, the blocking dielectric layer 52 includes aluminum oxide. In one embodiment, the blocking dielectric layer 52 can include multiple dielectric metal oxide layers having different material compositions.

Alternatively or additionally, the blocking dielectric layer 52 can include a dielectric semiconductor compound such as silicon oxide, silicon oxynitride, silicon nitride, or a combination thereof. In one embodiment, the blocking dielectric layer 52 can include silicon oxide. In this case, the dielectric semiconductor compound of the blocking dielectric layer 52 can be formed by a conformal deposition method such as low pressure chemical vapor deposition, atomic layer deposition, or a combination thereof. The thickness of the dielectric semiconductor compound can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Figure 5E:
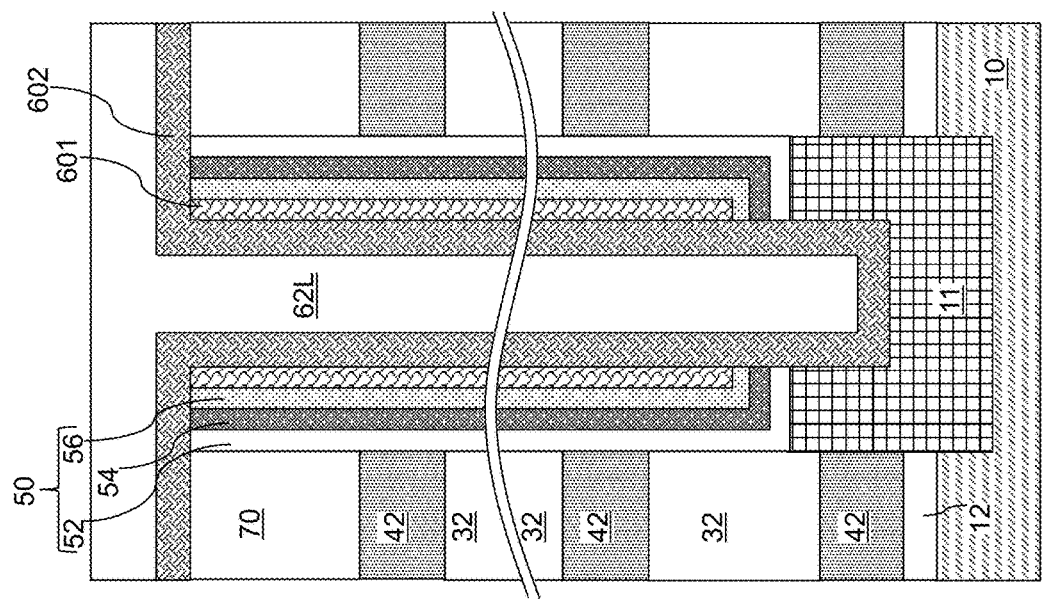

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening. The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 5F:
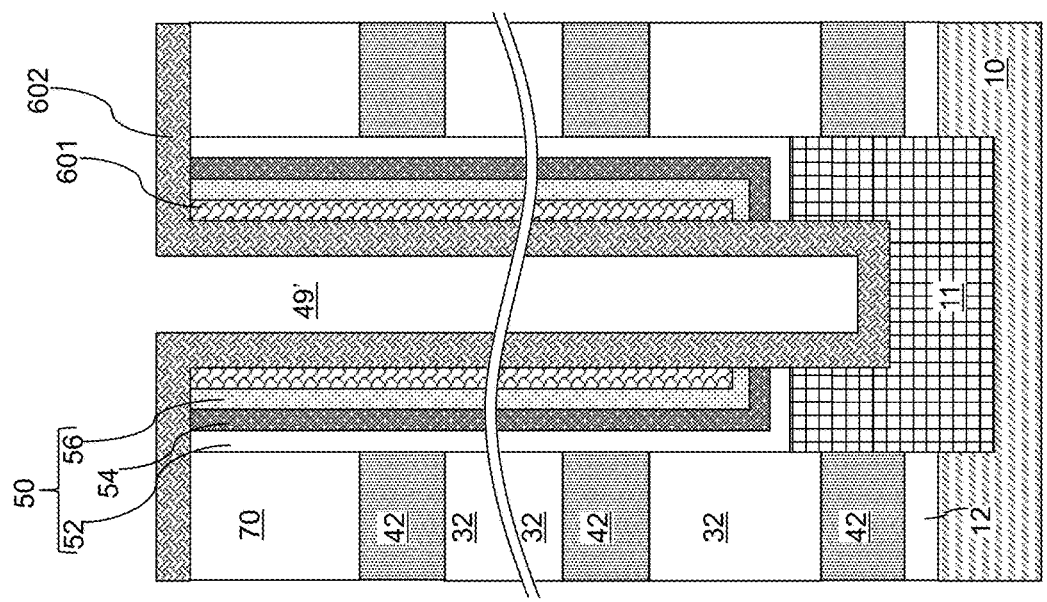

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602 located above the top surface of the insulating cap layer 70 can be removed by a planarization process, which can employ a recess etch or chemical mechanical planarization (CMP). Each remaining portion of the second semiconductor channel layer 602 can be located entirety within a memory opening 49 or entirely within a support opening 19.

Each adjoining pair of a first semiconductor channel layer 601 and a second semiconductor channel layer 602 can collectively form a vertical semiconductor channel 60 through which electrical current can flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a blocking dielectric layer 52, a charge storage layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The drain regions 63 can have a doping of a second conductivity type that is the opposite of the first conductivity type. For example, if the first conductivity type is p-type, the second conductivity type is n-type, and vice versa. The dopant concentration in the drain regions 63 can be in a range from $5.0\times10^{19}/cm^3$ to $2.0\times10^{21}/cm^3$, although lesser and greater dopant concentrations can also be employed. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each combination of a memory film 50 and a vertical semiconductor channel 60 (which is a vertical semiconductor channel) within a memory opening 49 constitutes a memory stack structure 55. The memory stack structure 55 is a combination of a semiconductor channel, a tunneling dielectric layer, a plurality of memory elements as embodied as portions of the charge storage layer 54, and an optional blocking dielectric layer 52. Each combination of a pedestal channel portion 11 (if present), a memory stack structure 55, a dielectric core 62, and a drain region 63 within a memory opening 49 is herein referred to as a memory opening fill structure (11, 55, 62, 63). Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
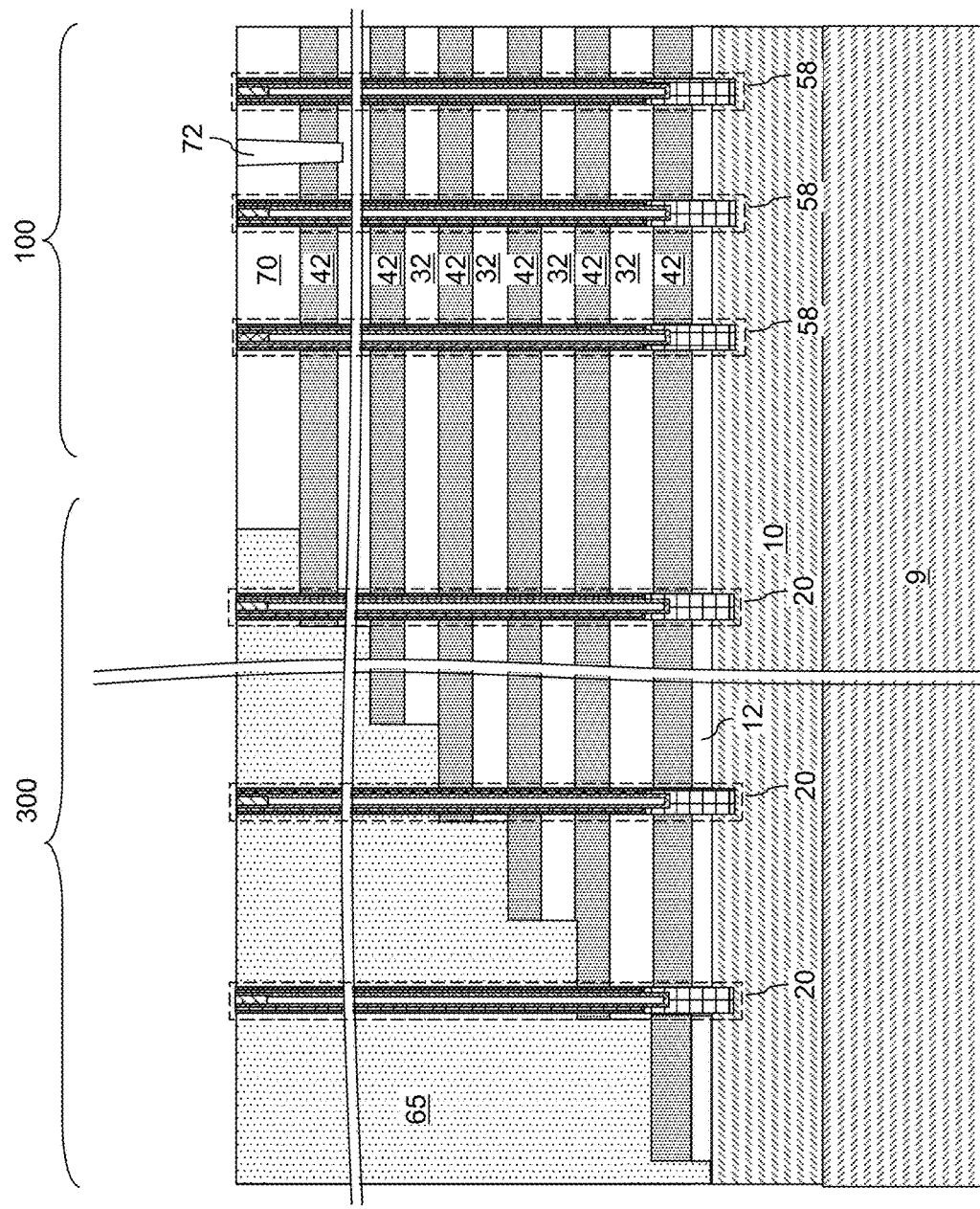
FIG. 6 is a schematic vertical cross-sectional view of the exemplary structure after formation of memory stack structures and support pillar structures according to an embodiment of the present disclosure.

Referring to FIG. 6, the exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each of the memory opening fill structure 58 can comprise a respective pedestal channel portion 11, a respective memory stack structure 55 (i.e., comprising a respective memory film 50 and a respective vertical semiconductor channel 60), and a respective drain region 63. Each of the support pillar structures 20 can comprise a respective pedestal channel portion 11, a respective memory film 50, a respective vertical semiconductor channel 60, and a respective dummy drain region 63 located at a top end of the respective vertical semiconductor channel 60. Each component of the support pillar structures 20 are dummy components that are electrically inactive and floating. In other words, each pedestal channel portion 11 of the support pillar structures 20 is a dummy pedestal channel portion, each memory film 50 of the support pillar structures 20 is a dummy memory film, each vertical semiconductor channel 60 of the support pillar structures 20 is a dummy vertical semiconductor channel, and each drain region 63 of the support pillar structures 20 is a dummy drain region which is not electrically connected to a bit line.

A subset, or all, of the support pillar structures 20 can be formed through horizontal surface of the stepped surfaces in the terrace region. One or more of the support pillar structures 20 can pass through a horizontal interface between the bottommost sacrificial material layer 42 and the retro-stepped dielectric material portion 65, and can include a respective pedestal channel portion 11 that contacts the retro-stepped dielectric material portion 65.

A memory film 50 and a vertical semiconductor channel 60 are formed directly on a respective pedestal channel portion 11 in each of the memory openings 49 and the support openings 19. Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
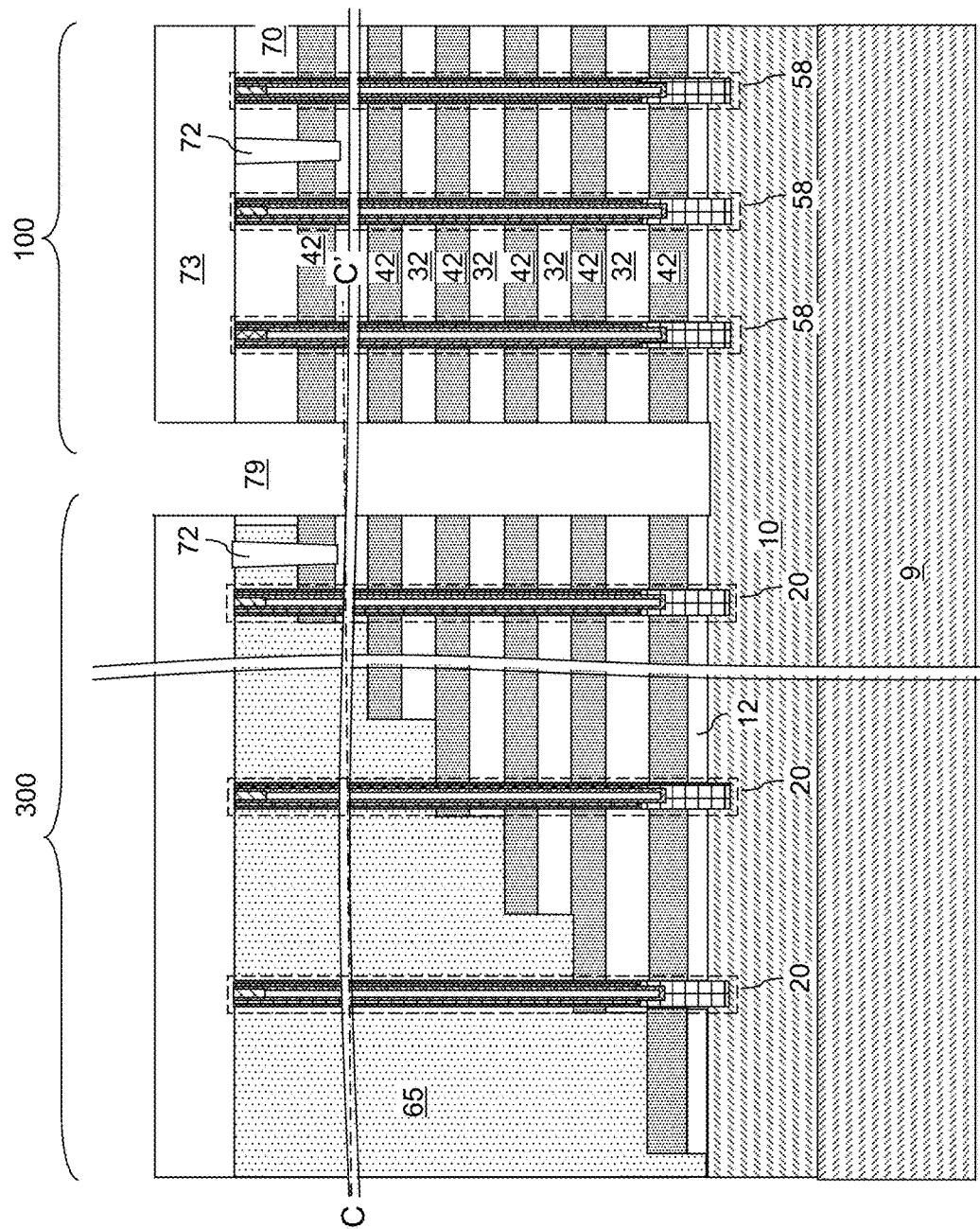
FIG. 7A is zig-zag a schematic vertical cross-sectional view of the exemplary structure after formation of a backside trench according to an embodiment of the present disclosure.
Figure 7B:
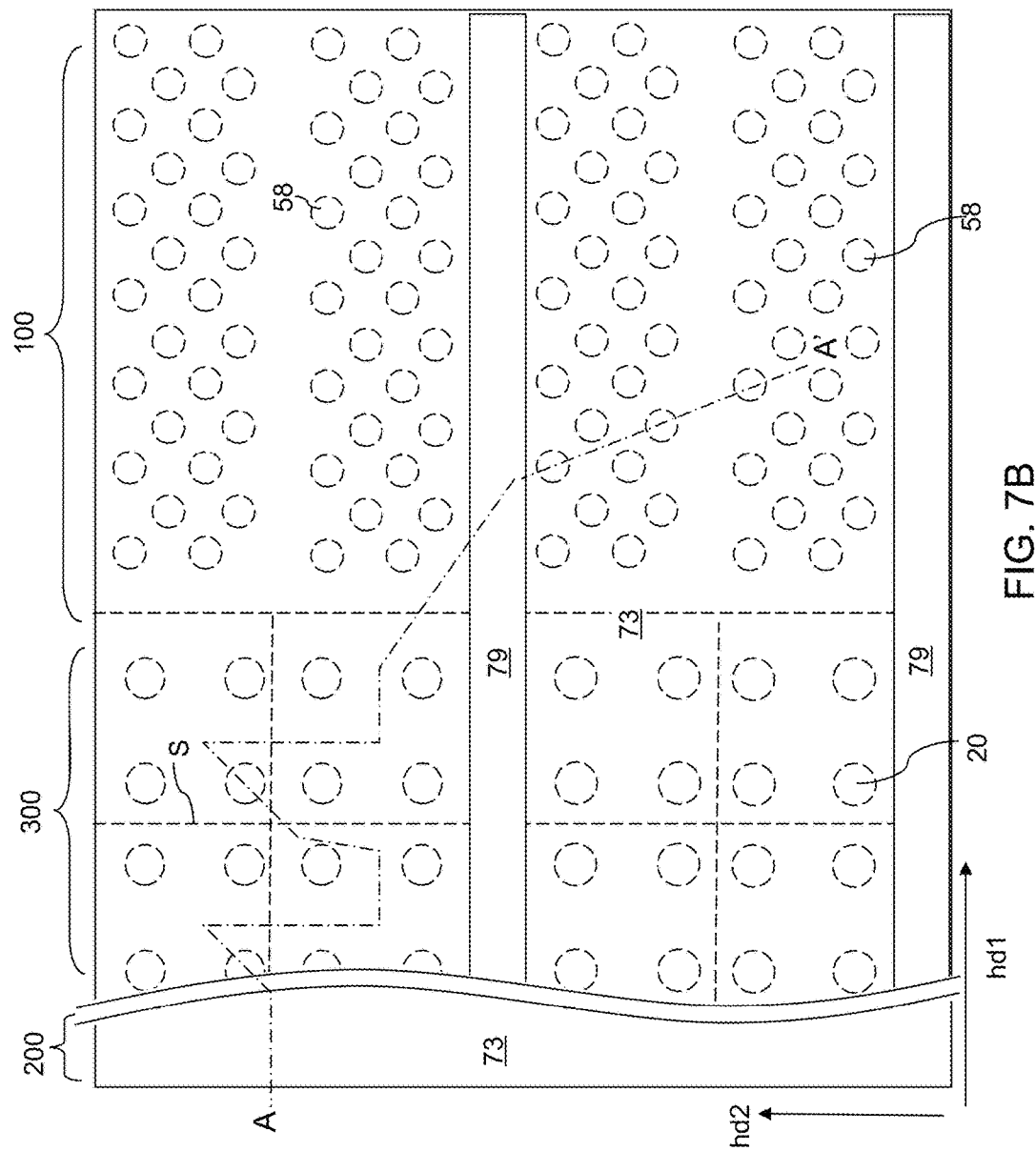
FIG. 7B is a partial see-through top-down view of the exemplary structure of FIG. 7A. The vertical plane A-A' is the plane of the schematic vertical cross-sectional view of FIG. 7A.
Figure 7C:
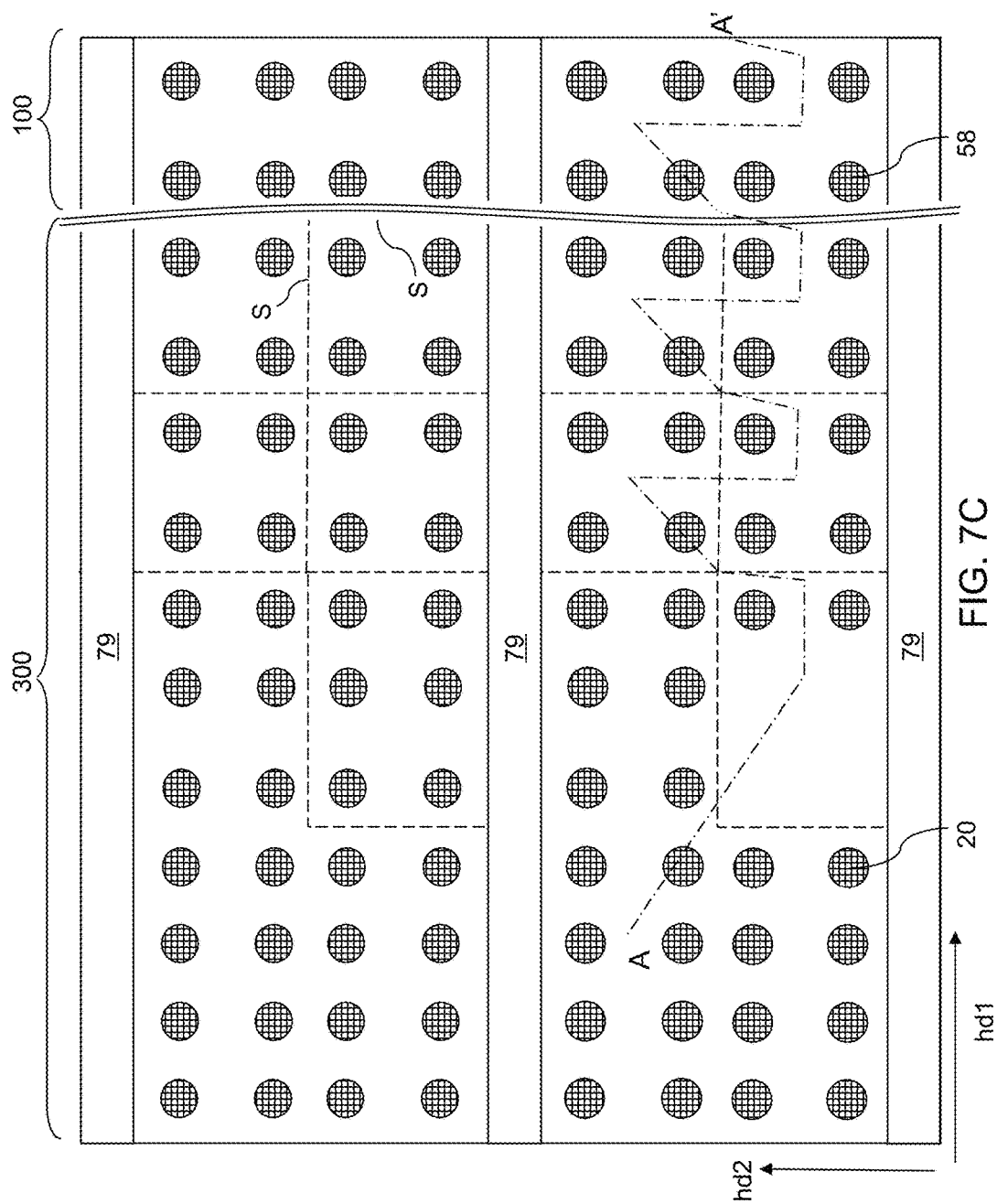
FIG. 7C is a horizontal cross-sectional view of the exemplary structure of FIGS. 7A and 7B along the horizontal plane C-C' of FIG. 7A.

Referring to FIGS. 7A-7C, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the contact region 300. In one embodiment, the backside trenches 79 can include a source contact opening in which a source contact via structure can be subsequently formed. The photoresist layer can be removed, for example, by ashing.

Figure 8:
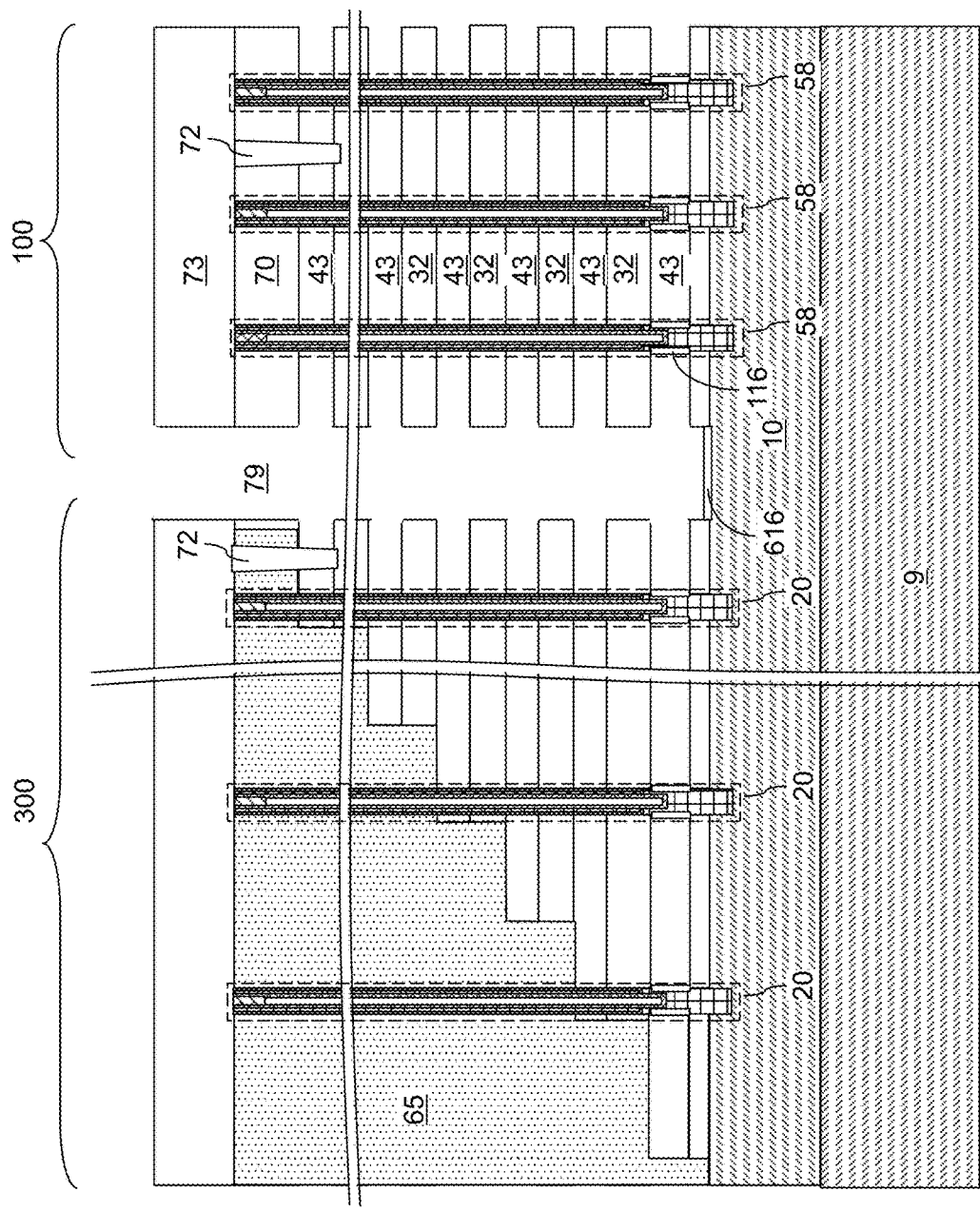
FIG. 8 is a zig-zag schematic vertical cross-sectional view of the exemplary structure after formation of backside recesses according to an embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Figure 9D:
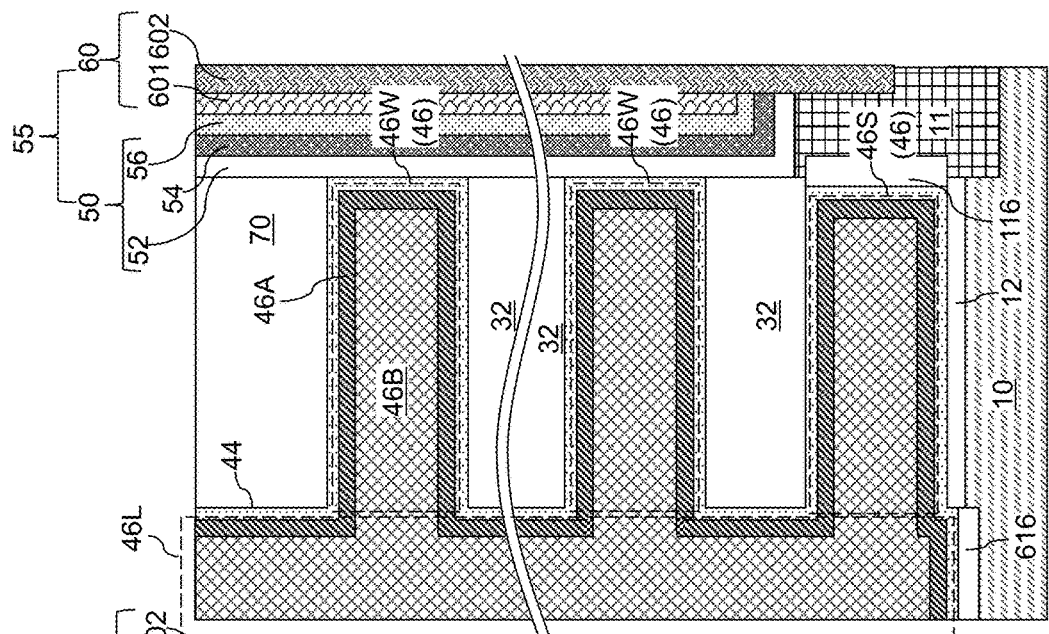
Figure 9C:
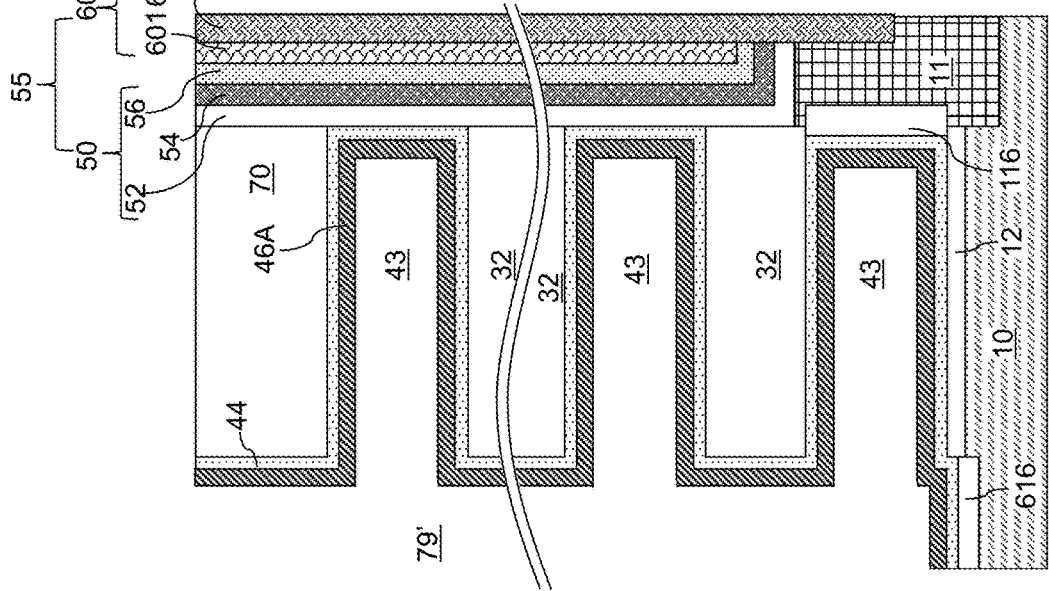

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
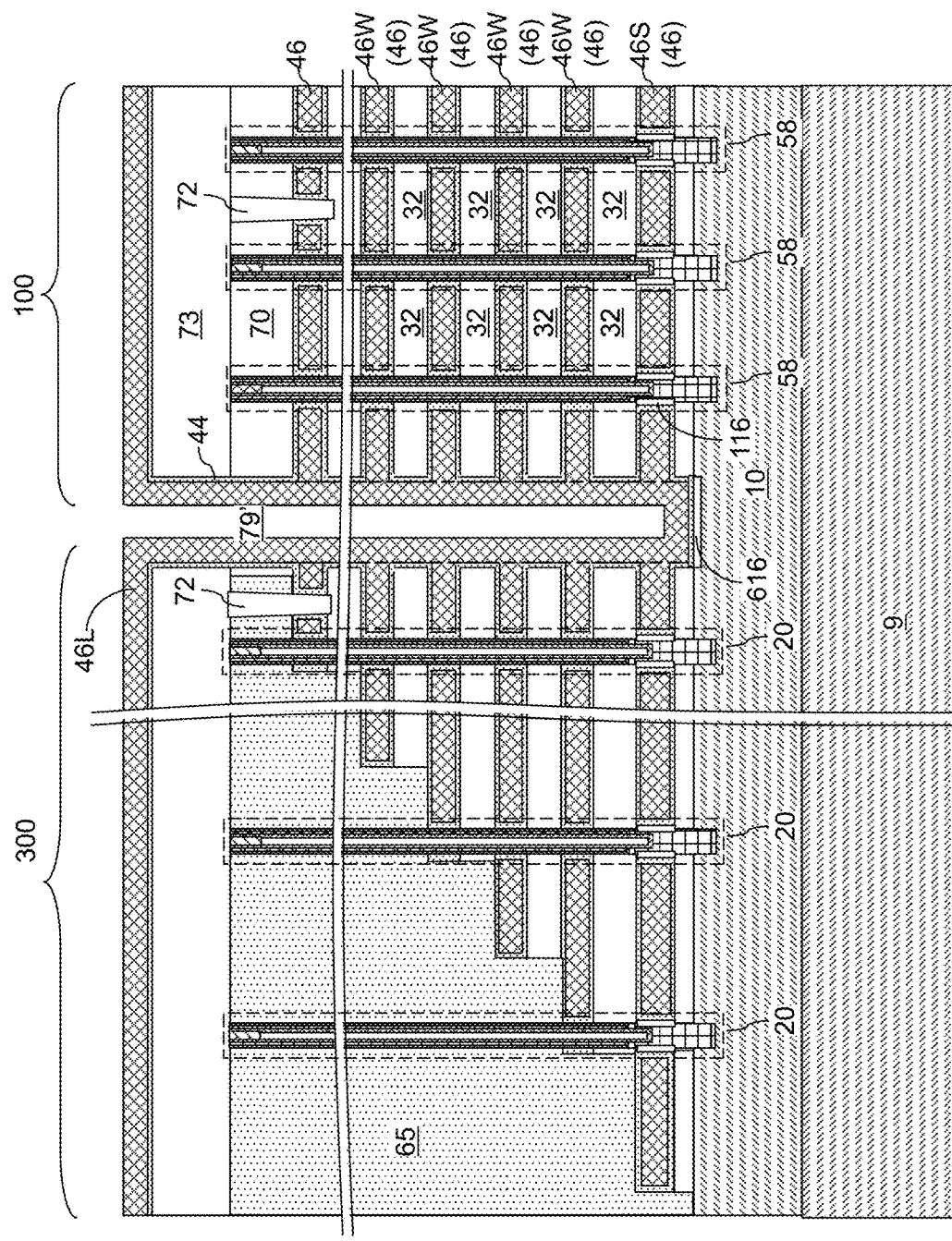
FIG. 10 is a zig-zag schematic vertical cross-sectional view of the exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous metallic material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers, which can be a pair of insulating layers 32, a bottommost insulating layer and a gate dielectric layer 12, or a topmost insulating layer and the insulating cap layer 70. The continuous metallic material layer 46L includes a continuous portion of the metallic barrier layer 46A and a continuous portion of the metallic fill material layer 46B that are located in the backside trenches 79 or above the contact level dielectric layer 73.

Figure 14A:
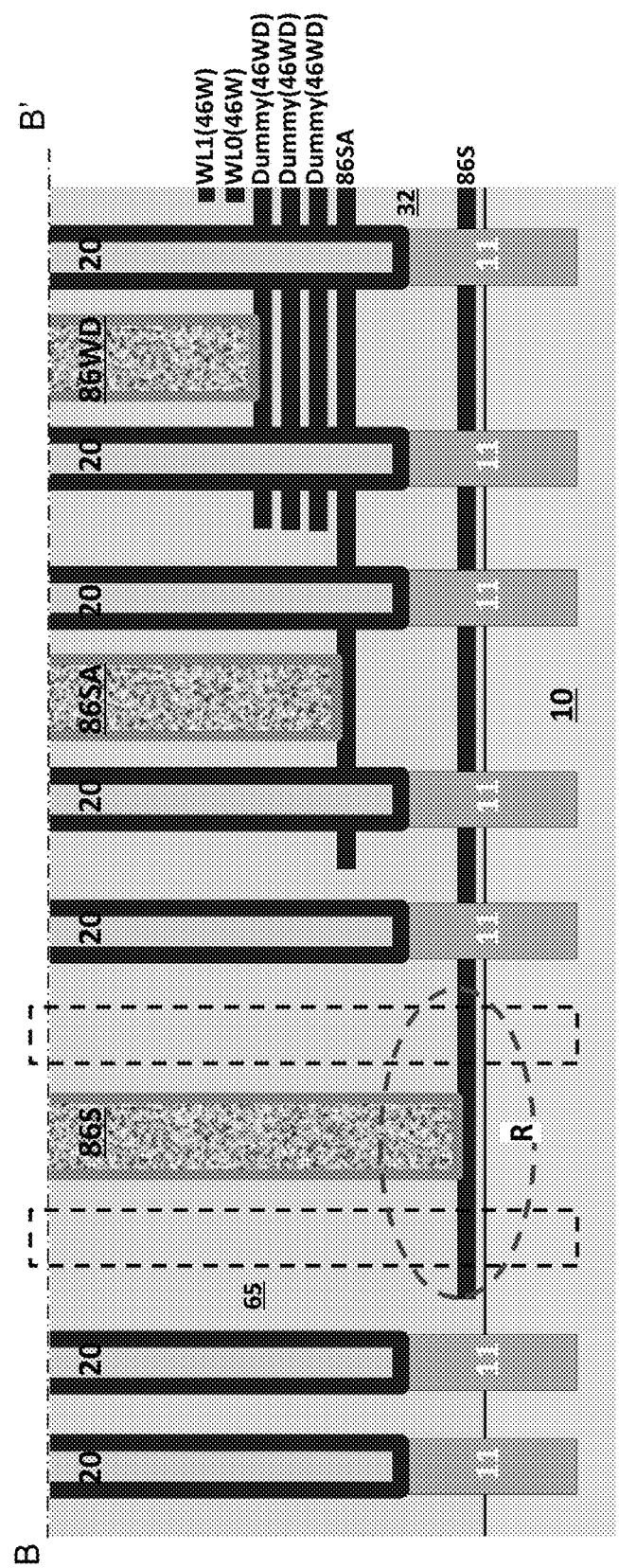
FIG. 14A is a zig-zag schematic vertical cross-sectional view of an alternative structure of an alternative embodiment of the present disclosure along plane B-B' shown in FIG. 14B.

The electrically conductive layers 46 include a bottommost electrically conductive layer and electrically conductive layers 46 that overlie the bottommost electrically conductive layer. The bottommost electrically conductive layer is located at a source select level, and thus, is herein referred to as a source select level electrically conductive layer 46S. The source select level electrically conductive layer 46S comprises a source select gate electrode, which selects a group of vertical semiconductor channels 60 located between a neighboring pair of backside trenches for access during operation of the three-dimensional memory device. The electrically conductive layers 46 that overlie the bottommost electrically conductive layer include optional one or more additional source select gate electrode(s) 46SA (shown in FIG. 14A), word line level electrically conductive layers 46W, which include, or are electrically connected (shorted) to, the word lines of the three-dimensional memory device, and optionally dummy word lines 46WD located between the source select gate electrodes and the word lines (as shown in FIG. 14A). If the drain select level isolation structures 72 are employed, at least one of the electrically conductive layers 46 including the topmost electrically conductive layer can be drain select level electrically conductive layers. The drain select level electrically conductive layers are laterally isolated among one another along the first horizontal direction by the drain select level isolation structures 72 that laterally extend along the first horizontal direction.

Each sacrificial material layer 42 can be replaced with an electrically conductive layer 46. A backside cavity 79' is present in the portion of each backside trench 79 that is not filled with the backside blocking dielectric layer 44 and the continuous metallic material layer 46L. Each tubular dielectric spacer 116 laterally surrounds a respective pedestal channel portion 11. A bottommost one of the electrically conductive layers 46 is the source select level electrically conductive layer 46S. The source select level electrically conductive layer 46S laterally surrounds each tubular dielectric spacer 116 upon formation of the electrically conductive layers 46. Each of the support pillar structures 20 comprises a tubular dielectric spacer 116 located between the pedestal channel portion 11 and the source select level electrically conductive layer.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each word line level electrically conductive layer 46W can function as a combination of a plurality of control gate electrodes located at a same level and a word line electrically interconnecting, i.e., electrically shorting, the plurality of control gate electrodes located at the same level. The plurality of control gate electrodes within the word line level electrically conductive layer 46W can be the control gate electrodes for the vertical memory devices including the memory stack structures 55. In other words, each word line level electrically conductive layer 46W can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. The gate dielectric layer 12 can be vertically spaced from the backside trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface, of the gate dielectric layer 12 can be physically exposed at the bottom of the backside trench 79 depending on whether the gate dielectric layer 12 is not removed or partially removed during removal of the continuous electrically conductive material layer 46L. The planar dielectric portion 616 may be collaterally removed during removal of the continuous electrically conductive material layer 46L. A backside cavity 79' is present within each backside trench 79.

Figure 12A:
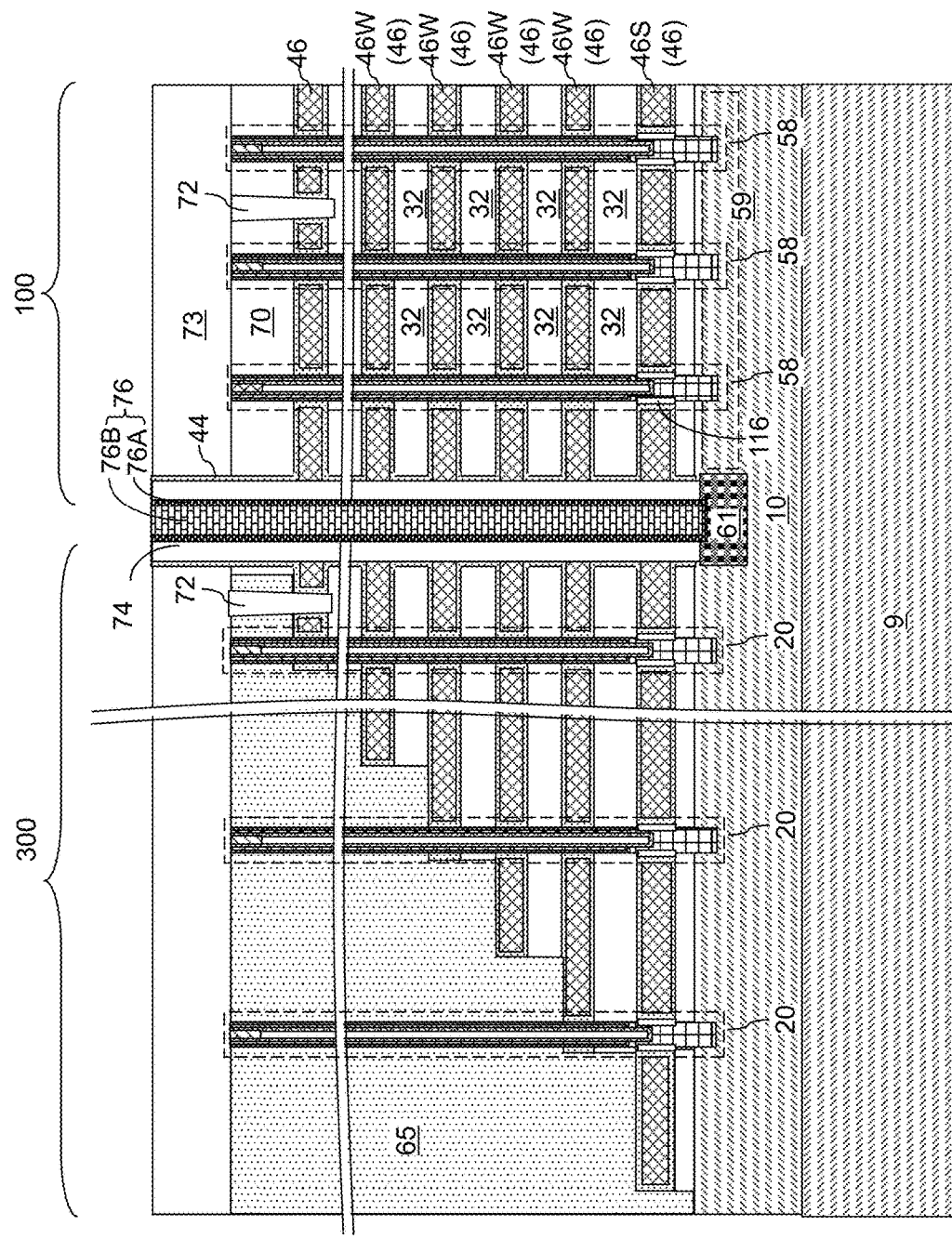
FIG. 12A is a zig-zag schematic vertical cross-sectional view of the exemplary structure after formation of an insulating spacer and a backside contact structure according to an embodiment of the present disclosure.
Figure 12B:
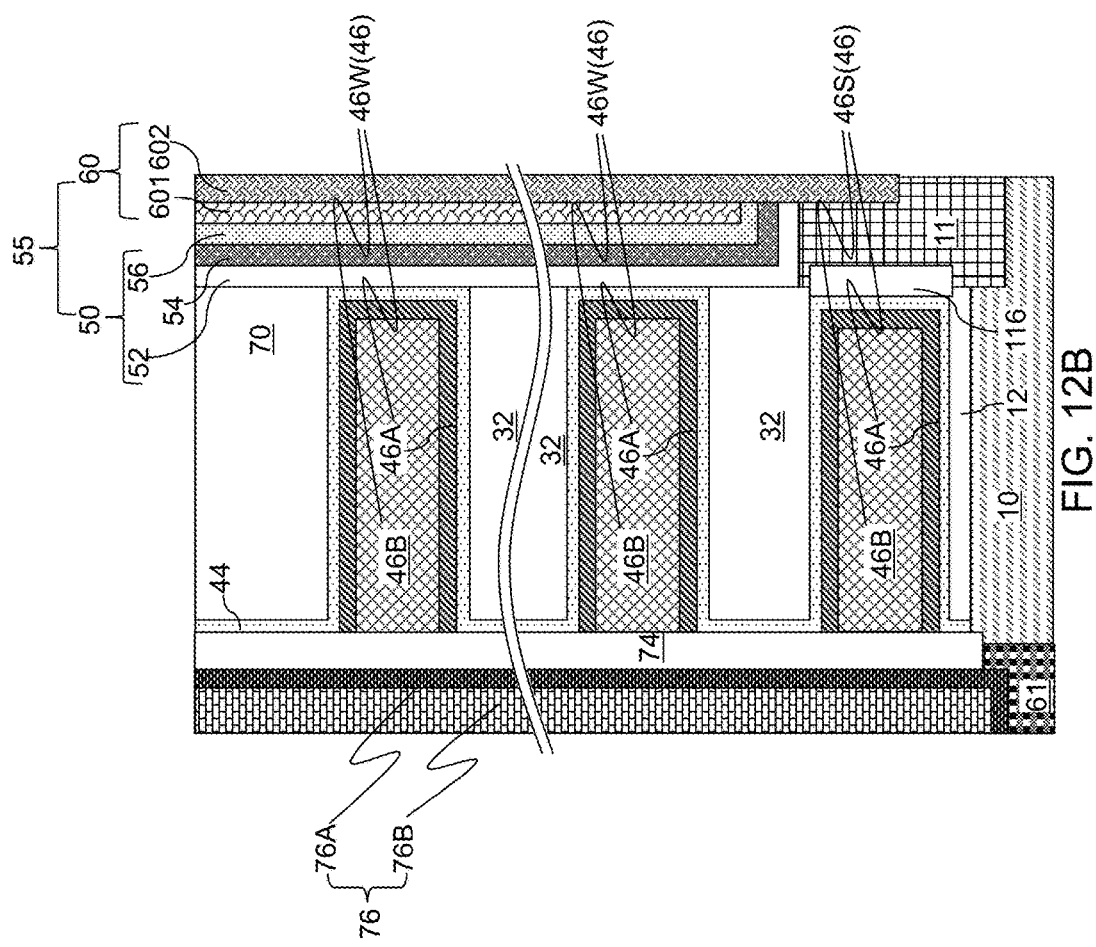
FIG. 12B is a magnified view of a region of the exemplary structure of FIG. 12A.

Referring to FIGS. 12A and 12B, an insulating material layer can be formed in the at least one backside trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the planar dielectric portion 616 that underlies the opening through the insulating spacer 74. A top surface of the semiconductor material layer 10 can be physically exposed at the bottom of each backside trench 79.

A source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each source region 61 is formed in an upper portion of the semiconductor substrate (9, 10). Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the source region 61. If a backside blocking dielectric layer 44 is employed, the backside contact via structure 76 can contact a sidewall of the backside blocking dielectric layer 44.

Referring to FIGS. 13A-13E, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Conductive line contact via structures 86 can be formed on the electrically conductive layers 46 through the contact level dielectric layer 73, and through the retro-stepped dielectric material portion 65. Peripheral device contact via structures 8P can be formed through the retro-stepped dielectric material portion 65 directly on respective nodes of the peripheral devices.

The conductive line contact via structures 86 can include source select level contact via structures 86S that contact the source select level electrically conductive layer 46S, word line level contact via structures 86W that contact a respective one of the word line level electrically conductive layers 46W, and drain select level contact via structures 86D that contact a respective drain select level electrically conductive layer 46D.

Figure 13A:
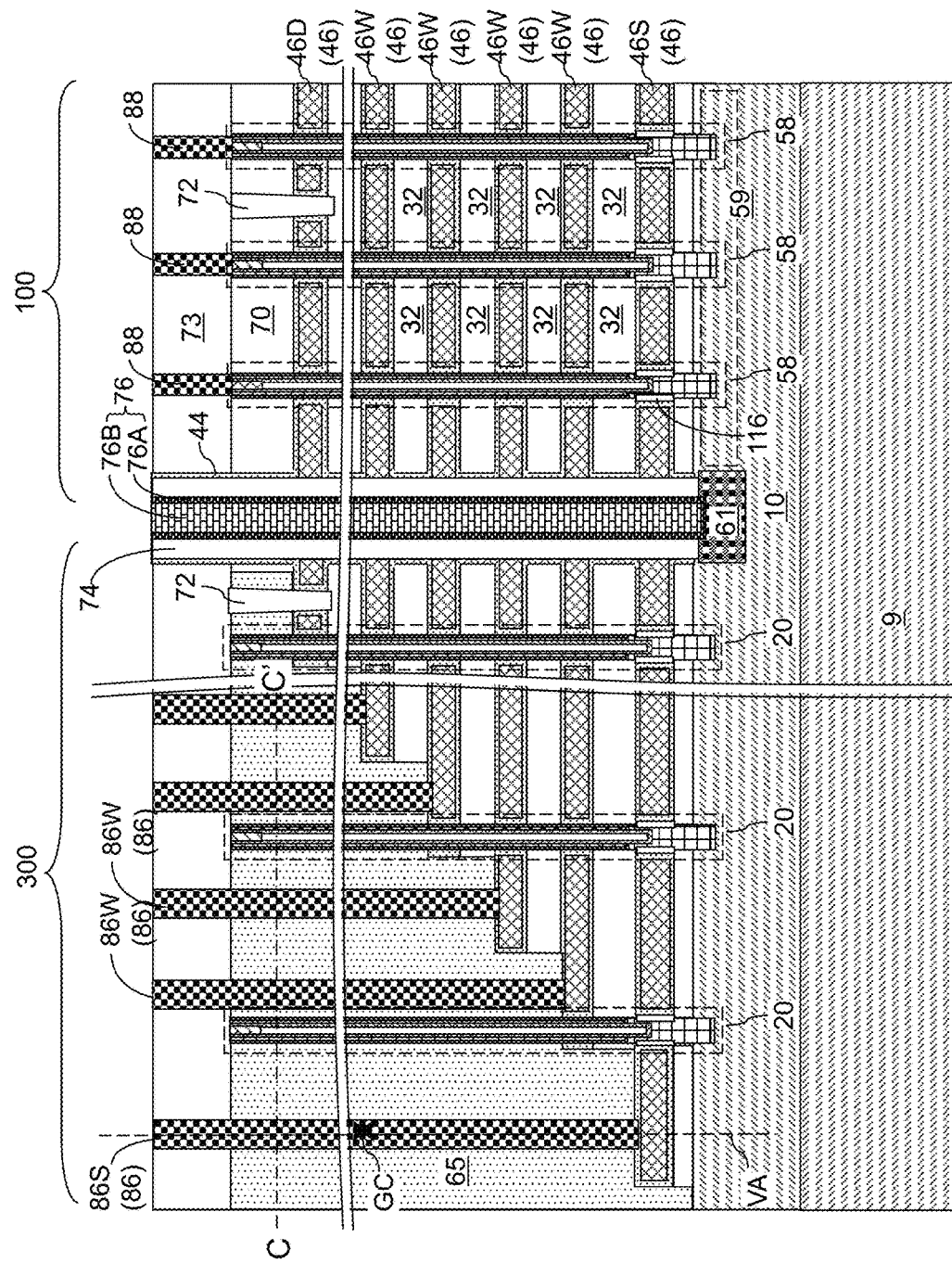
FIG. 13A is a zig-zag schematic vertical cross-sectional view of the exemplary structure after formation of additional contact via structures according to an embodiment of the present disclosure.
Figure 13C:
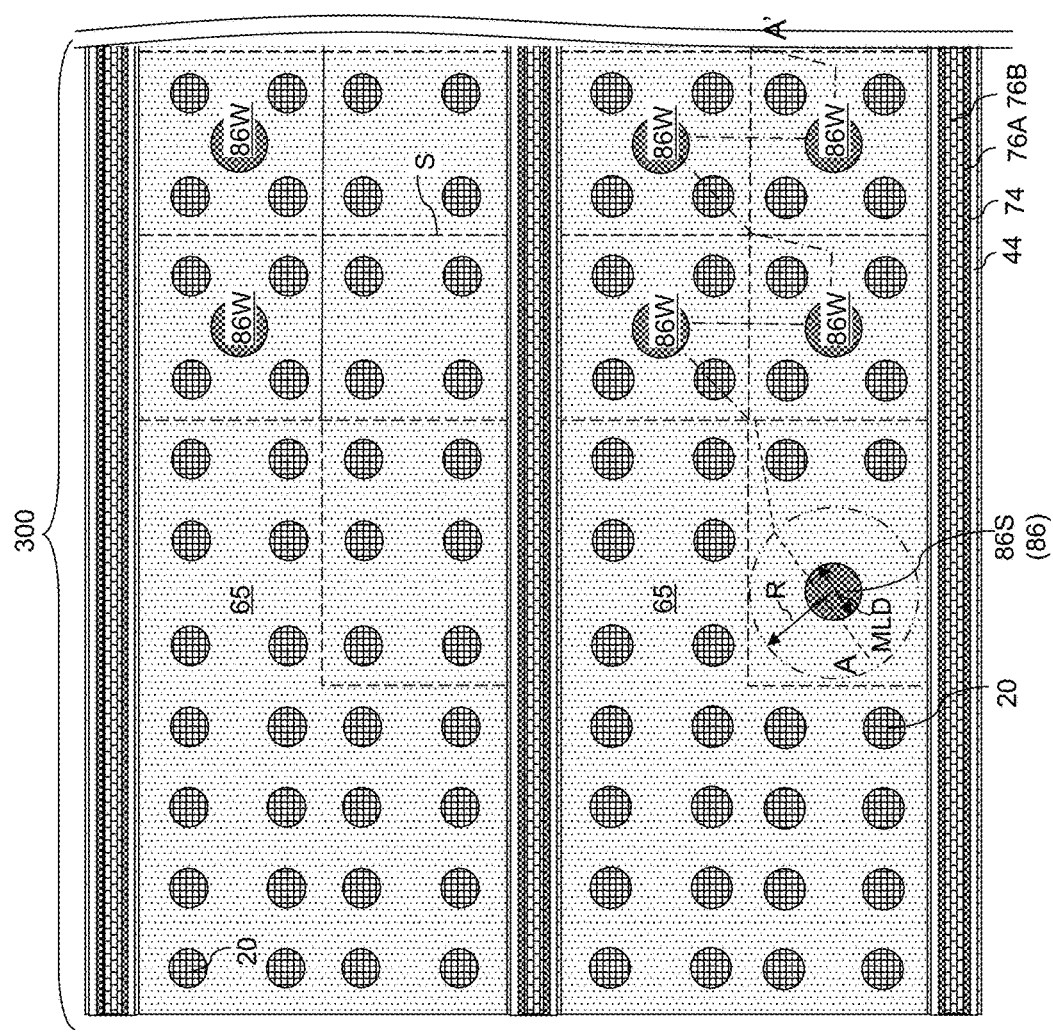
FIG. 13C is a horizontal cross-sectional view of the exemplary structure of FIGS. 13A and 13B along the horizontal plane C-C' of FIG. 13A.
Figure 13D:
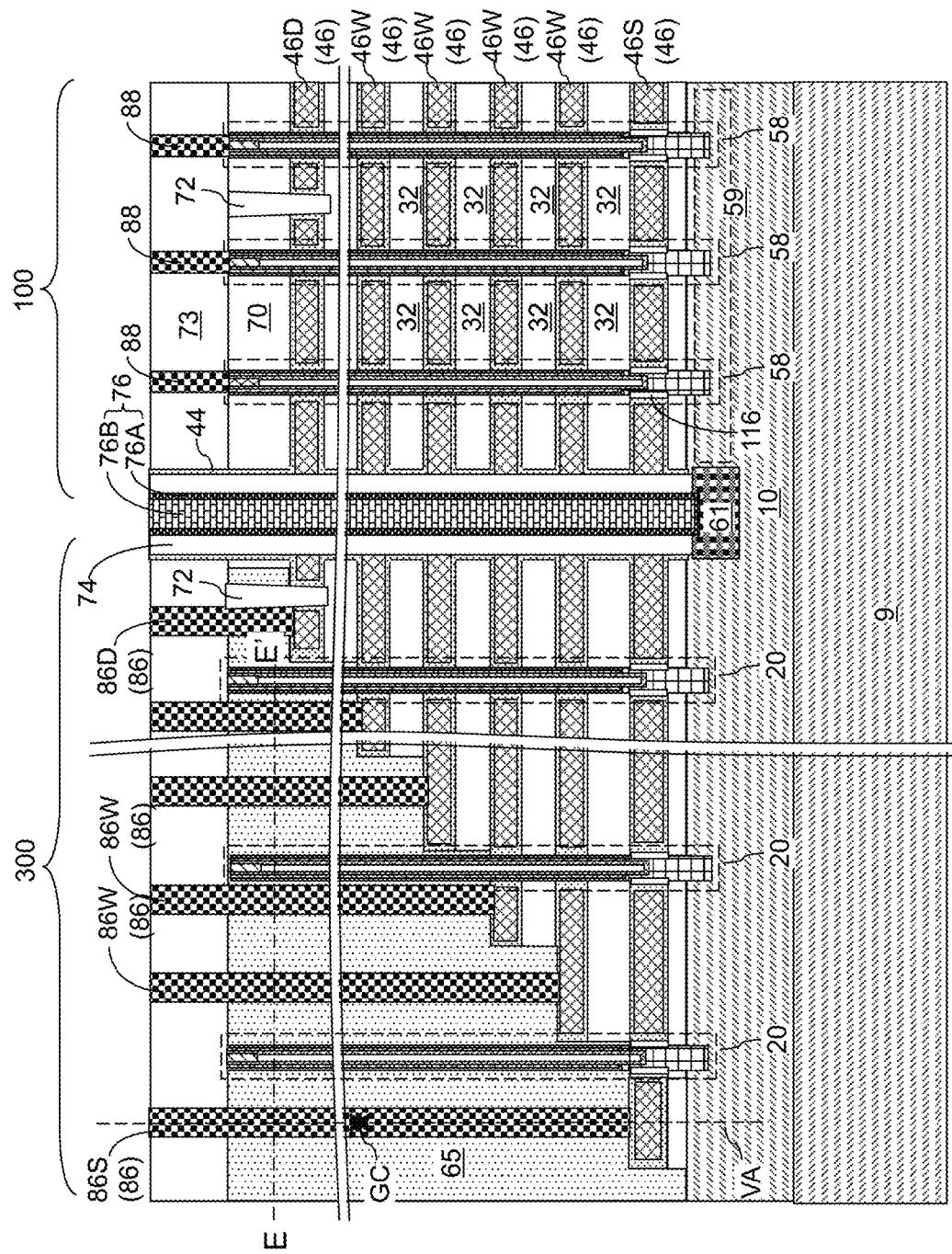
FIG. 13D is another zig-zag schematic vertical cross-sectional view of the exemplary structure after formation of the additional contact via structures along the plane D-D' in FIG. 13E.
Figure 13E:
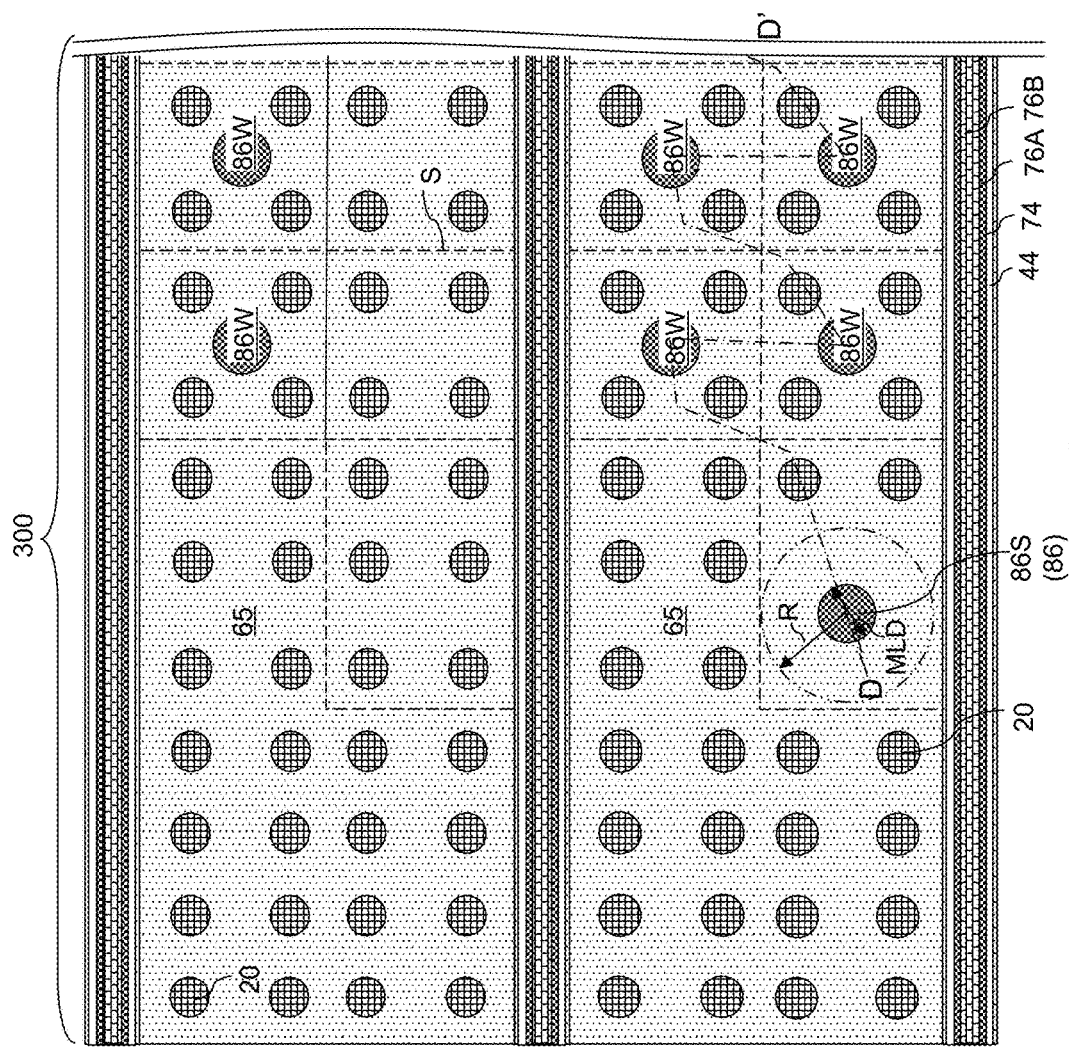
FIG. 13E is the same view as FIG. 13C. The zig-zag vertical cross-sectional plane D-D' is illustrated.
Figure 14B:
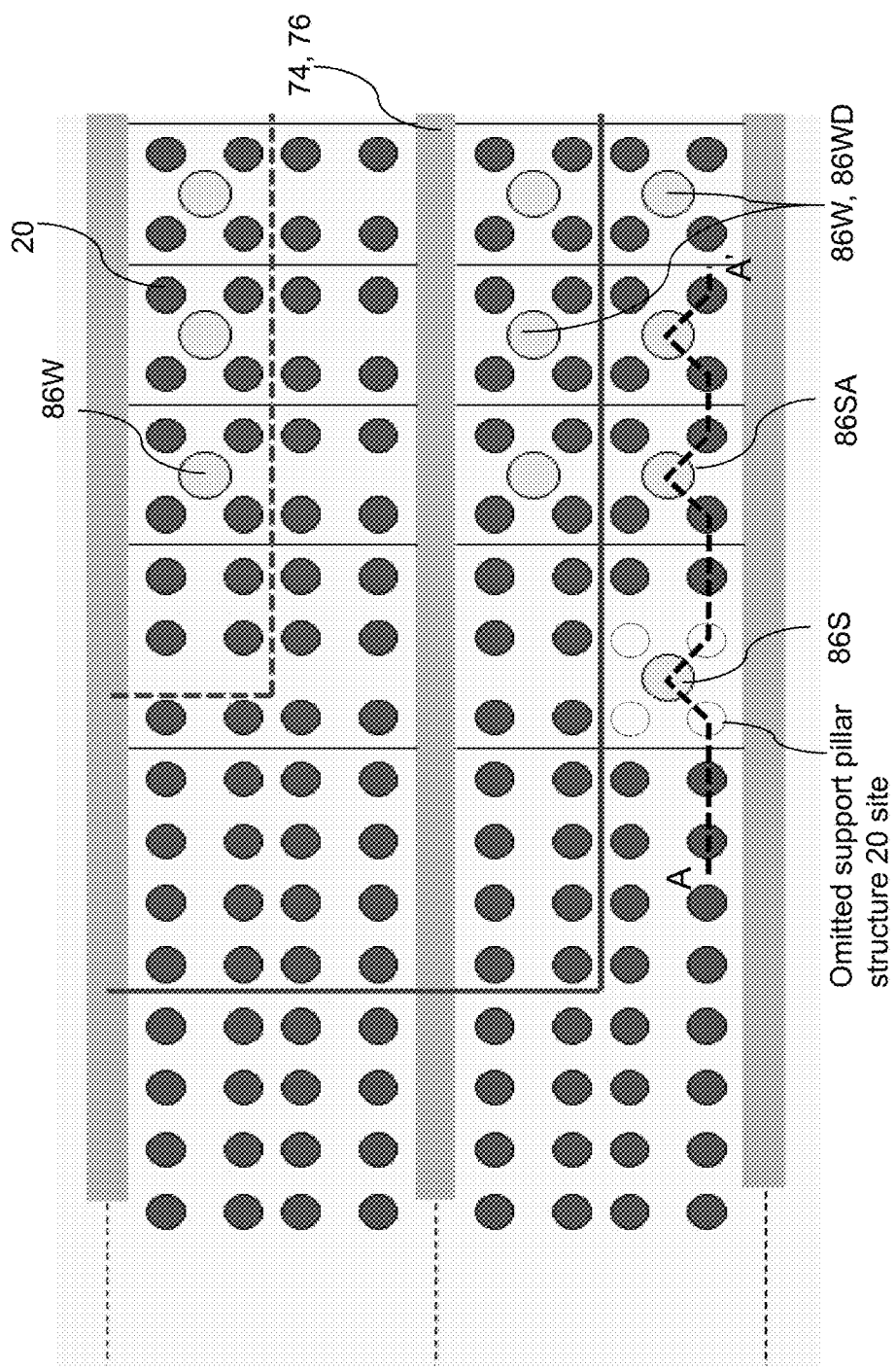
FIG. 14B is a top-down view of the alternative embodiment structure of FIG. 14A. The vertical plane A-A' is the plane of the schematic vertical cross-sectional view of FIG. 14A.

FIGS. 14A-14B illustrate a lower portion of the contact region 300 of an alternative embodiment of the present disclosure. In this embodiment, the alternating stack can also include additional source select gate electrodes 46SA and optional dummy word lines 46WD, and respective contact via structures 86SA and 86WD. The dummy word lines 46WD do not control memory cell charge storage state, while the word lines 46W function as control gate electrodes of the NAND device and control memory cell charge storage state. As shown in FIGS. 13C, 13E and 14B, each of the contact via structures 86 (e.g., 86SA, 86W, 86WD) except the source select level contact via structures 86S can be laterally surrounded by a respective set of support pillar structures 20. In one embodiment, each of the contact via structures 86 can be formed within a space that is laterally confined by four support pillar structures 20 passing through openings in a same horizontal plane that is an interface between a horizontal top surface of an electrically conductive layer 46 and the retro-stepped dielectric material portion 65. However, the four support pillar structures 20 around the source select level contact via structure 86S are omitted.

The support pillar structures 20 function to prevent bending and collapse of thin insulating layers 32 while the backside recesses 43 are present. In case the insulating layer (e.g., retro-stepped dielectric material portion 65 and/or a lower insulating layer 32) that directly overlies the bottommost backside recess 43 has a sufficient thickness, the bending of this insulating layer overlying the bottommost backside recess 43 can be insignificant due to the mechanical strength that such a thick insulating layer provides. In an illustrative example, the thickness of the insulating layer overlying the bottommost backside recess 43 can be in a range from 60 nm to 600 nm, and the lateral dimension of each step in the stepped surfaces can be in a range from 200 nm to 4,000 nm. In this case, the mechanical strength of the insulating layer overlying the bottommost backside recess 43 can be sufficient to prevent collapse even without the support pillar structures 20 within the area for the source select gate contact via structure 86S.

In one embodiment, the minimum lateral separation distance between the source select level contact via structure 86S and the support pillar structures 20 can be greater than any minimum lateral separation distance between the word line level contact via structures 86W and the support pillar structures 20. In one embodiment, the entire volume within three times, such as within 2.5 times, such as within two times (i.e., twice), such as within one and a half times a maximum lateral dimension MLD of the source select gate contact via structure 86S from a vertical axis VA passing through a geometrical center GC of the source select gate contact via structure 86S is free of any support pillar structure 20. The support pillar structures 20 are located around (i.e., within twice maximum lateral dimensions) of the remaining word line gate contact via structures (86W, 86WD) and the drain select gate contact via structures, as shown in FIG. 14B.

In one embodiment, the source select level contact via structure 86S can be formed at a location that is laterally spaced from a nearest sidewall of the source select level electrically conductive layer 46S by a lateral separation distance that is greater than a maximum lateral dimension MLD of the source select gate contact via structure 46S. As used herein, a "maximum lateral dimension" of an element refers to a maximum dimension of the element that can be measured in the entire collection of horizontal cross-sectional views of the element. In some cases, the maximum lateral dimension MLS of the source select level electrically conductive layer 46S can be a diameter of the source select level electrically conductive layer 46S. In some other cases, the maximum lateral dimension MLS of the source select level electrically conductive layer 46S can be a major axis of the largest ellipse that can be found among the horizontal cross-sectional shapes of the source select level electrically conductive layer 46S. The source select level electrically conductive layer 46S may have a vertical sidewall, or a tapered sidewall.

For example, the radius of a cylinder that is centered at the vertical axis VA passing through the geometrical center GC of the source select contact via structure 86S and tangentially touching a nearest sidewall of the source select gate contact via structure 46S can have a radius R that is at least one and a half times the maximum lateral dimension MLD of the source select gate contact via structure 86S. In one embodiment, each of the word line level contact via structures 86W can be formed with a respective maximum lateral dimension, and can be laterally spaced from a nearest one of the support pillar structures 20 by a lateral distance that is less than the respective maximum lateral dimension. In one embodiment, the maximum lateral dimension MLD of the source select gate contact via structure 86S can be the same as the maximum lateral dimension of the word line level contact via structures 86W.

The exemplary structure of the present disclosure includes a three-dimensional memory device. The three-dimensional memory device comprises: an alternating stack (32, 46) of insulating layers 32 and electrically conductive layers 46 located over a substrate (9, 10), wherein the electrically conductive layers 46 comprise a source select level electrically conductive layer 46S and word line level electrically conductive layers 46W located over the source select level electrically conductive layer 46S; memory stack structures 55 extending through the alternating stack (32, 46), wherein each of the memory stack structures 55 comprises a memory film 50 and a vertical semiconductor channel 60 contacting an inner sidewall of the memory film 50; a terrace region in which each electrically conductive layer 46 other than a topmost electrically conductive layer 46 within the alternating stack (32, 46) laterally extends farther than an overlying electrically conductive layer 46 within the alternating stack (32, 46); a retro-stepped dielectric material portion 65 overlying the terrace region; support pillar structures 20 located in the terrace region and extending through the retro-stepped dielectric material portion 65 and the alternating stack (32, 46); a source select level contact via structure 86S extending though the retro-stepped dielectric material portion 65 and contacting the source select level electrically conductive layer 46S; and word line level contact via structures 86W extending though the retro-stepped dielectric material portion 65 and contacting a respective one of the word line level electrically conductive layers 46W; wherein a minimum lateral separation distance between the source select level contact via structure 86S and the support pillar structures 20 is greater than any minimum lateral separation distance between the word line level contact via structures 86W and the support pillar structures 20.

In one embodiment, the source select level electrically conductive layer 46S comprises a source select gate electrode, an entire volume within two times a maximum lateral dimension MLD of the source select gate contact via structure 86S from a vertical axis VA passing through a geometrical center GC of the source select gate contact via structure 86S can be free of any support pillar structure 20, and can consist of the dielectric material of the retro-stepped dielectric material portion 65 between a horizontal plane including the top surface of the topmost layer of the alternating stack (32, 46) and a horizontal plane including the top surface of the source select level electrically conductive layer 46S.

In one embodiment, stepped surfaces continuously extend from a bottommost layer of the alternating stack (32, 46) to a topmost layer of the alternating stack (32, 46) in the terrace region, and the support pillar structures 20 pass through each horizontal surface of the stepped surfaces. In one embodiment, each of the word line level contact via structures 46W has a respective maximum lateral dimension, and is laterally spaced from a nearest one of the support pillar structures 20 by a lateral distance that is less than the respective maximum lateral dimension. For example, the maximum diameter of each word line level contact via structures 46W can be greater than the minimum lateral distance between the word line level contact via structures 46W and the support pillar structures 20. In one embodiment, the source select level contact via structure 86S can be laterally spaced from a nearest sidewall of the source select level electrically conductive layer 46S by a lateral separation distance that is greater than the maximum lateral dimension of the source select gate contact via structure 86S.

In one embodiment, each of the support pillar structures 20 comprises a pedestal channel portion 11 contacting a semiconductor material layer 10 in the substrate (9, 10). In one embodiment, each of the support pillar structures 20 comprises a tubular dielectric spacer 116 located between the pedestal channel portion 11 and the source select level electrically conductive layer 46S.

In one embodiment, each of the support pillar structures 20 comprises a memory film 50, a vertical semiconductor channel 60 located within the memory film 50 and contacting the pedestal channel portion 11, and a drain region 63 located at a top end of the vertical semiconductor channel 60. In one embodiment, one of the support pillar structures 20 passes through the source select level electrically conductive layer 46S and the retro-stepped dielectric material portion 65 and includes a respective pedestal channel portion 11 that contacts the retro-stepped dielectric material portion 65. In this case, such a support pillar structure 20 does not pass through any other electrically conductive layer 46 other than the source select level electrically conductive layer 46S.

In an embodiment, each memory stack structure 55 overlies, and contacts, a respective pedestal channel portion 11, an upper end of each vertical semiconductor channel 60 is contacted by a respective drain region 63, and each drain region 63 contacting a memory stack structure 55 is contacted by a respective drain contact via structure 88 embedded within a contact level dielectric layer 73 that overlies the memory stack structures 55 in the memory array region (e.g., memory plane) 100. An entire top surface of each of the support pillar structures 20 can be contacted by a bottom surface of the contact level dielectric layer 73 in the contact region 300.

In one embodiment, the three-dimensional memory device comprises a vertical NAND memory device. The electrically conductive layers 46 can comprise, or can be electrically connected to, a respective word line of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (as embodied as a portion of a charge storage layer 54 at a level of a word line level electrically conductive layer 46W) in a first device level of the array of monolithic three-dimensional NAND strings can be located over another memory cell (as embodied as another portion of the charge storage layer 54 at a level of another word line level electrically conductive layer 46W) in a second device level of the array of monolithic three-dimensional NAND strings. The silicon substrate can contain an integrated circuit comprising a driver circuit for the memory device located thereon. The word line level electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode located in a first device level and a second control gate electrode located in a second device level. The array of monolithic three-dimensional NAND strings can comprise: a plurality of semiconductor channels (59, 11, 60), wherein at least one end portion 60 of each of the plurality of semiconductor channels (59, 11, 60) extends substantially perpendicular to a top surface of the substrate (9, 10); and a plurality of charge storage elements (as embodied as charge trapping material portions). Each charge storage element can be located adjacent to a respective one of the plurality of semiconductor channels (59, 11, 60).

Figure 15:
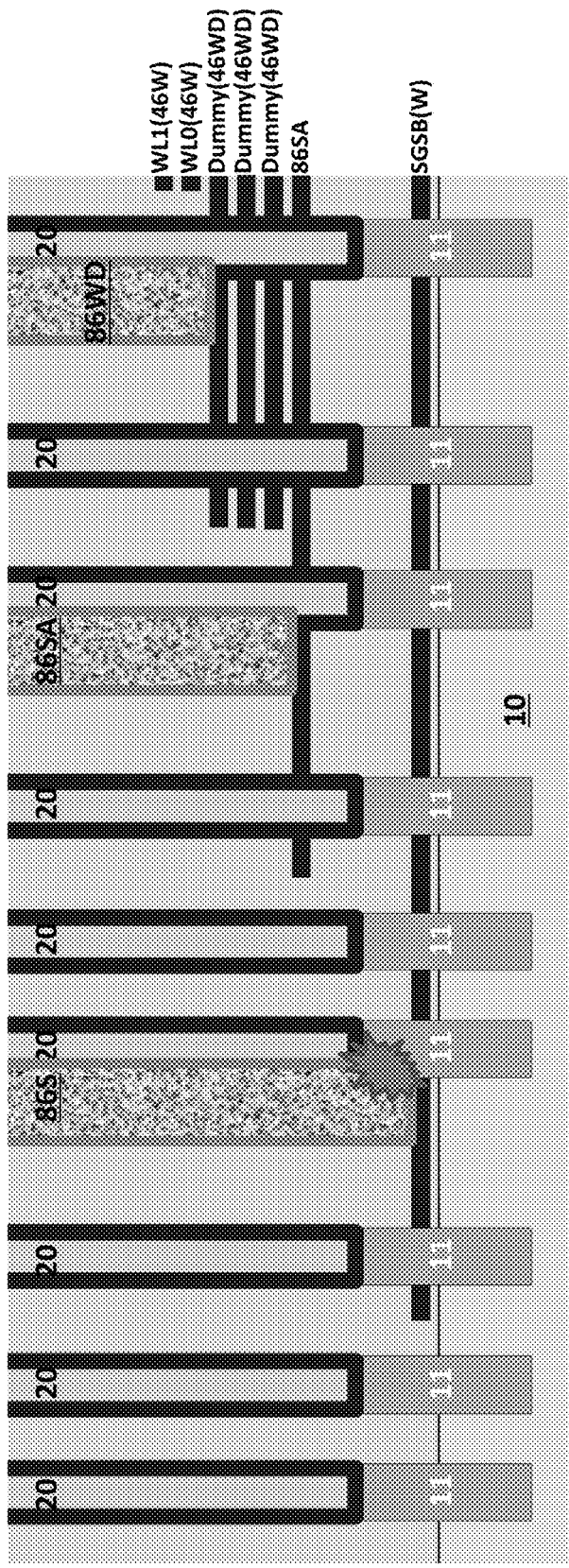
FIG. 15 is a zig-zag schematic vertical cross-sectional view of an prior art structure.

As shown in FIG. 15, overlay variation between the support pillar structures 20 and the conductive layer contact via structures 86 can occur in the manufacturing process of a prior art three-dimensional memory device. Further, the top surfaces of the pedestal channel portions 11 are formed above the horizontal plane including the top surface of the source select level electrically conductive layer 46S because the source select level electrically conductive layer 46S needs to provide electrical bias over its entire thickness. A sidewall of the pedestal channel portion 11 located within each support pillar structure 20 extending through only the source select level electrically conductive layer 46S and not extending through any of the word line level electrically conductive layers 46W contacts the retro-stepped dielectric material portion 65. Such pedestal channel portion 11 are prone to electrical shorts to the source select level contact via structures 86S, as shown in FIG. 15.

In embodiments of the present disclosure, by eliminating support pillar structures 20 from a predefined volume centered at the geometrical center of each source select level contact via structure 86S, the possibility of electrical short between the source select level contact via structures 86S and the pedestal channel portions 11 can be reduced or eliminated. Thus, an electrical short caused by misalignment of source select level contact via structure 86S and support pillar structures 20 can be prevented by modifying the pattern of the support pillar structures 20 such that the support pillar structures 20 are omitted from the area in which source select gate contact via structures 86 are formed. The retro-stepped dielectric material portion 65 at the level overlying the source select level electrically conductive layer 46S has a sufficient thickness to prevent deformation during formation of the backside recesses 43 such that support pillar structures 20 are not required in the area of the source select level contact via structure 86S.

The methods and structures of the present disclosure can provide a higher yield and enhanced reliability of the three-dimensional memory device through the geometrical configuration of the various elements including the source select level contact via structures 86S and the support pillar structures 20.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:
    a first insulating layer located over a substrate, a source select level electrically conductive layer located over the first insulating layer and an alternating stack of insulating layers and electrically conductive layers located over the substrate, wherein the electrically conductive layers comprise word line level electrically conductive layers located over the source select level electrically conductive layer;
    memory stack structures extending through the alternating stack, wherein each of the memory stack structures comprises a memory film and a vertical semiconductor channel contacting an inner sidewall of the memory film;
    a terrace region in which each electrically conductive layer other than a topmost electrically conductive layer within the alternating stack laterally extends farther than an overlying electrically conductive layer within the alternating stack;
    a retro-stepped dielectric material portion overlying the terrace region;
    support pillar structures located in the terrace region and extending through the retro-stepped dielectric material portion and the alternating stack;
    a source select level contact via structure extending though the retro-stepped dielectric material portion and contacting the source select level electrically conductive layer; and
    word line level contact via structures extending though the retro-stepped dielectric material portion and contacting a respective one of the word line level electrically conductive layers;
    wherein a minimum lateral separation distance between the source select level contact via structure and the support pillar structures is greater than any minimum lateral separation distance between the word line level contact via structures and the support pillar structures.

2. The three-dimensional memory device of claim 1, wherein:
    the source select level electrically conductive layer comprises a source select gate electrode; and
    an entire volume within two times a maximum lateral dimension of the source select gate contact via structure from a vertical axis passing through a geometrical center of the source select gate contact via structure is free of any support pillar structure.

3. The three-dimensional memory device of claim 1, wherein
    stepped surfaces continuously extend from a bottommost layer of the alternating stack to a topmost layer of the alternating stack in the terrace region; and
    the support pillar structures pass through each horizontal surface of the stepped surfaces.

4. The three-dimensional memory device of claim 1, wherein the source select level contact via structure is laterally spaced from a nearest sidewall of the source select level electrically conductive layer by a lateral separation distance that is greater than a maximum lateral dimension of the source select gate contact via structure.

5. The three-dimensional memory device of claim 1, wherein each of the support pillar structures comprises a pedestal channel portion contacting a semiconductor material layer in the substrate.

6. The three-dimensional memory device of claim 1, wherein:
    the three-dimensional memory device comprises a monolithic three-dimensional NAND memory device;
    the word line level electrically conductive layers comprise, or are electrically connected to, a respective word line of the monolithic three-dimensional NAND memory device;
    the substrate comprises a silicon substrate;
    the monolithic three-dimensional NAND memory device comprises an array of monolithic three-dimensional NAND strings over the silicon substrate;
    at least one memory cell in a first device level of the array of monolithic three-dimensional NAND strings is located over another memory cell in a second device level of the array of monolithic three-dimensional NAND strings;
    the silicon substrate contains an integrated circuit comprising a driver circuit for the memory device located thereon;
    the word line level electrically conductive layers comprise a plurality of control gate electrodes having a strip shape extending substantially parallel to the top surface of the substrate, the plurality of control gate electrodes comprise at least a first control gate electrode located in the first device level and a second control gate electrode located in the second device level; and
    the array of monolithic three-dimensional NAND strings comprises:
    a plurality of semiconductor channels, wherein at least one end portion of each of the plurality of semiconductor channels extends substantially perpendicular to a top surface of the substrate, and
    a plurality of charge storage elements, each charge storage element located adjacent to a respective one of the plurality of semiconductor channels.

7. The three-dimensional memory device of claim 3, wherein each of the word line level contact via structures has a respective maximum lateral dimension, and is laterally spaced from a nearest one of the support pillar structures by a lateral distance that is less than the respective maximum lateral dimension.

8. The three-dimensional memory device of claim 5, wherein each of the support pillar structures comprises a tubular dielectric spacer located between the pedestal channel portion and the source select level electrically conductive layer.

9. The three-dimensional memory device of claim 5, wherein each of the support pillar structures comprises a memory film, a vertical semiconductor channel located within the memory film and contacting the pedestal channel portion, and a drain region located at a top end of the vertical semiconductor channel.

10. The three-dimensional memory device of claim 9, wherein one of the support pillar structures passes through the source select level electrically conductive layer and the retro-stepped dielectric material portion, includes a respective pedestal channel portion that contacts the retro-stepped dielectric material portion, and does not pass through any of the word line level electrically conductive layers.

11. The three-dimensional memory device of claim 9, wherein:
- each memory stack structure overlies a respective pedestal channel portion;
- an upper end of each vertical semiconductor channel is contacted by a respective drain region;
- each drain region contacting a memory stack structure is contacted by a respective drain contact via structure embedded within a contact level dielectric layer that overlies the memory stack structures; and
- an entire top surface of each of the support pillar structures is contacted by a bottom surface of the contact level dielectric layer.

* * * * *